United States Patent [19]
Sato et al.

[11] Patent Number: 5,359,572
[45] Date of Patent: Oct. 25, 1994

[54] SEMICONDUCTOR STORAGE DEVICE

[75] Inventors: Yoichi Sato, Iruma; Satoshi Shinagawa, Akishima; Masao Mizukami, Yokohama, all of Japan

[73] Assignees: Hitachi, Ltd., Tokyo; Hitachi, VLSI Eng. Corp., Kodaira, both of Japan

[21] Appl. No.: 872,841

[22] Filed: Apr. 23, 1992

[30] Foreign Application Priority Data

Apr. 23, 1991 [JP] Japan ............................... 3-119284

[51] Int. Cl.$^5$ ............................................. G11C 8/00
[52] U.S. Cl. ........................... 365/230.03; 365/230.1; 365/230.06
[58] Field of Search ........... 365/230.03, 230.01, 365/230.06, 189.01

[56] References Cited

U.S. PATENT DOCUMENTS

| | | | |
|---|---|---|---|
| 4,932,000 | 6/1990 | Kodama et al. | 365/230.03 |
| 4,939,696 | 7/1990 | Katsuo et al. | 365/230.03 |
| 4,958,326 | 9/1990 | Sakurai | 365/230.03 |
| 4,973,373 | 11/1990 | Kim et al. | 365/230.03 |
| 4,977,538 | 12/1990 | Anami et al. | 365/230.03 |
| 5,024,842 | 4/1993 | Umeki | 365/230.03 |
| 5,083,294 | 1/1992 | Okajima | 365/230.03 |
| 5,097,450 | 3/1992 | Toda et al. | 365/230.03 |

FOREIGN PATENT DOCUMENTS

| | | |
|---|---|---|
| 58-211393 | 12/1983 | Japan . |
| 59-72699 | 4/1984 | Japan . |
| 62-75996 | 4/1987 | Japan . |

OTHER PUBLICATIONS

1987 IEEE International Solid-State Circuits Conference: Session XXI: Telecommunication IC's *A 1024-Channel Multifunction Digital Switching IC*, K. Ikuzaki et al.

*Primary Examiner*—Eugene R. LaRoche
*Assistant Examiner*—Tan Nguyen
*Attorney, Agent, or Firm*—Antonelli, Terry, Stout & Kraus

[57] ABSTRACT

A memory array of a static RAM or the like is divided in a word line extending direction to constitute a plurality of sub memory arrays SM0 to SM7, and array selecting signals for selecting the sub memory arrays and sub word line selecting signals for selecting sub word lines are combined to form word line selecting signals selectively. Main word lines M0000 to M0003 for transmitting those word line signals are arranged in parallel with the sub word lines SW000 to SW255. Sub word line drive circuits SWD000 to SWD255 are also coupled to the individual sub word lines for bringing the corresponding sub word lines selectively into selected states by combining at least 2 bits of the word line selecting signals.

14 Claims, 21 Drawing Sheets

BSYN : SYNCHRONOUS CIRCUIT
VDSR : VARIABLE DELAY SHIFT RESISTOR
SPM : SPEECH PASS MEMORY
CM : CONTROL MEMORY
FSYN : FRAME SYNCHRONIZING CIRCUIT
PINT : PROCESSOR INTERFACE CIRCUIT
PB : PROCESSOR BUS

FIG. 6

| CM(16KWx16b) | | | | | |
|---|---|---|---|---|---|
| | MB 15 | EQ 15 | WC 15 | RC 15 | OC 15 |
| | MB 14 | EQ 14 | WC 14 | RC 14 | OC 14 |
| | MB 13 | EQ 13 | WC 13 | RC 13 | OC 13 |
| | MB 12 | EQ 12 | WC 12 | RC 12 | OC 12 |
| | MB 11 | EQ 11 | WC 11 | RC 11 | OC 11 |
| | MB 10 | EQ 10 | WC 10 | RC 10 | OC 10 |
| | MB 9 | EQ 9 | WC 9 | RC 9 | OC 9 |
| | MB 8 | EQ 8 | WC 8 | RC 8 | OC 8 |
| | XD | PD1 ~PD7 | | CLKB AB RWB DIB | |
| | MB 7 | EQ 7 | WC 7 | RC 7 | OC 7 |
| | MB 6 | EQ 6 | WC 6 | RC 6 | OC 6 |
| | MB 5 | EQ 5 | WC 5 | RC 5 | OC 5 |
| | MB 4 | EQ 4 | WC 4 | RC 4 | OC 4 |
| | MB 3 | EQ 3 | WC 3 | RC 3 | OC 3 |
| | MB 2 | EQ 2 | WC 2 | RC 2 | OC 2 |
| | MB 1 | EQ 1 | WC 1 | RC 1 | OC 1 |
| | MB 0 | EQ 0 | WC 0 | RC 0 | OC 0 |

FIG. 8
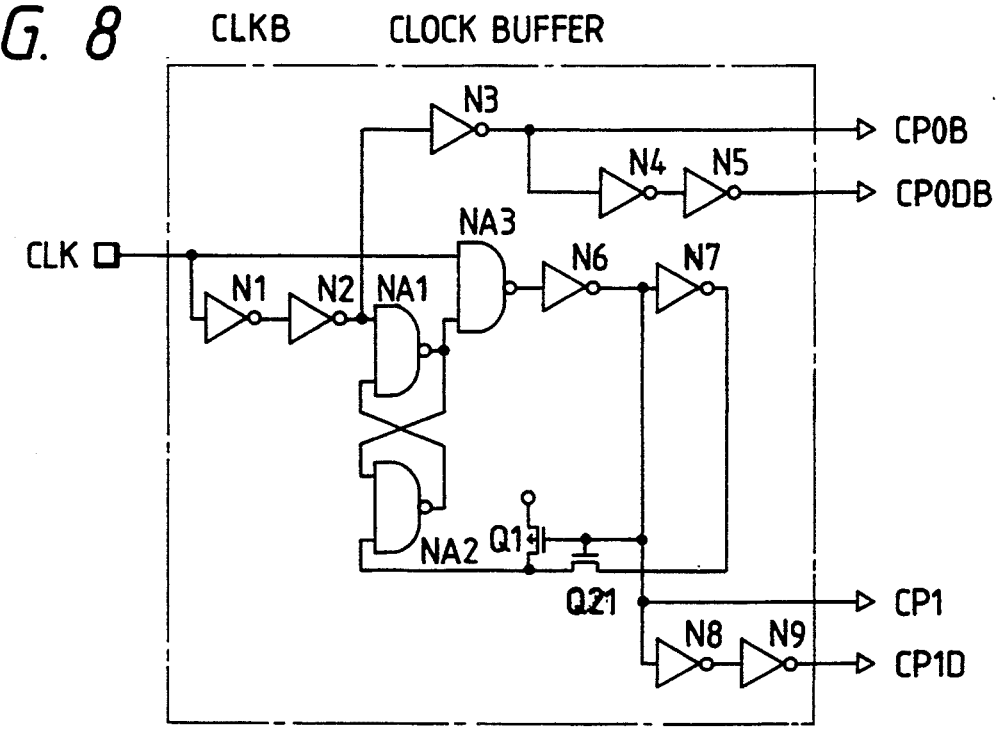
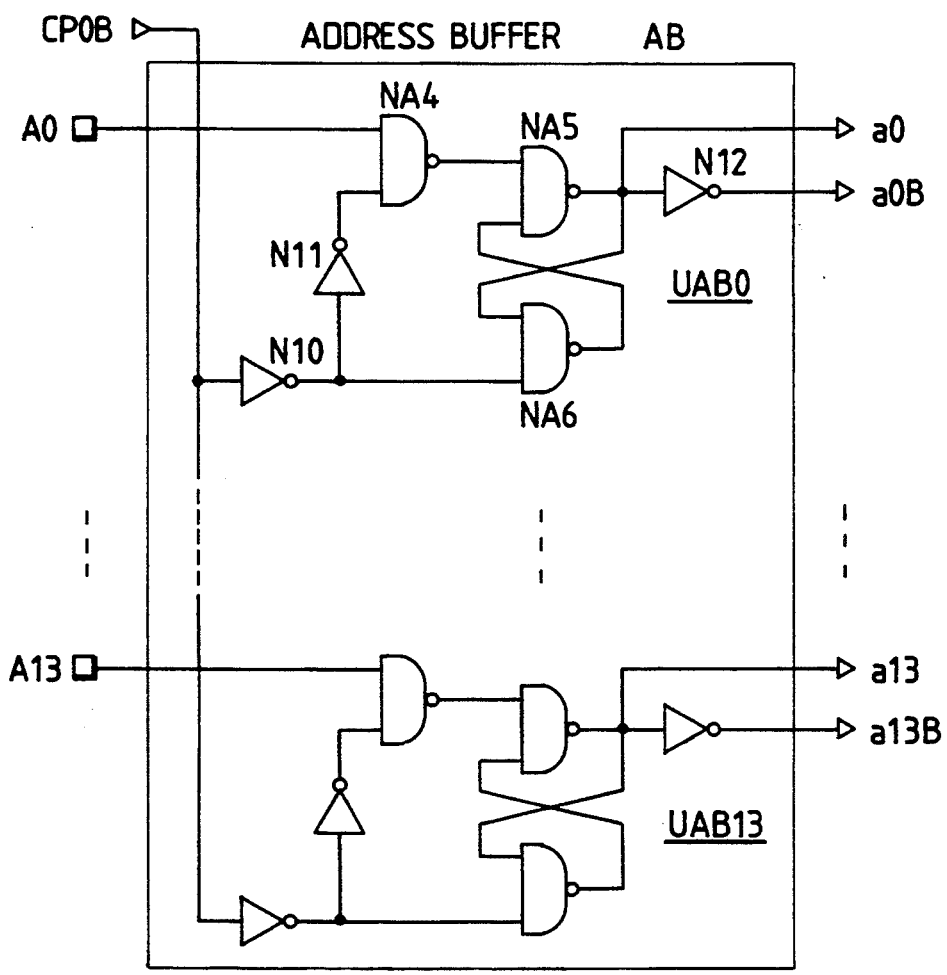

FIG. 9
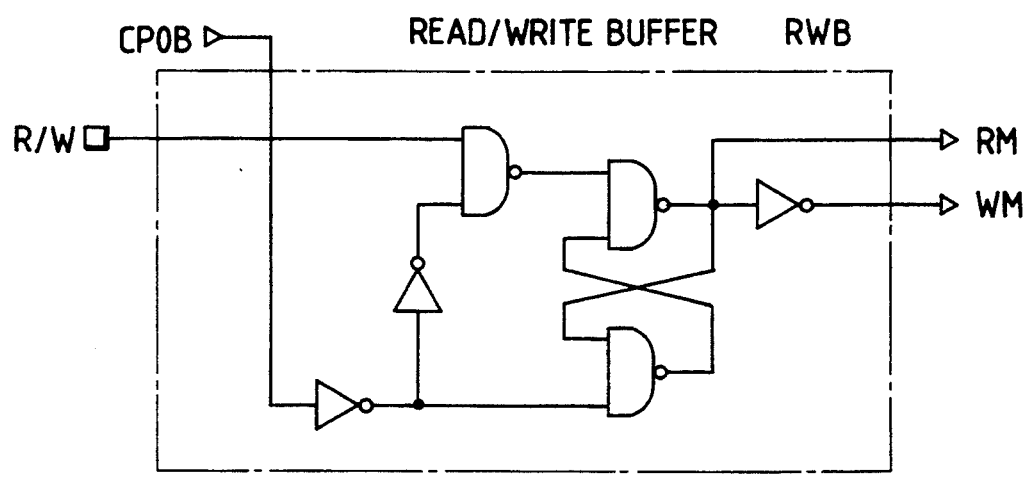
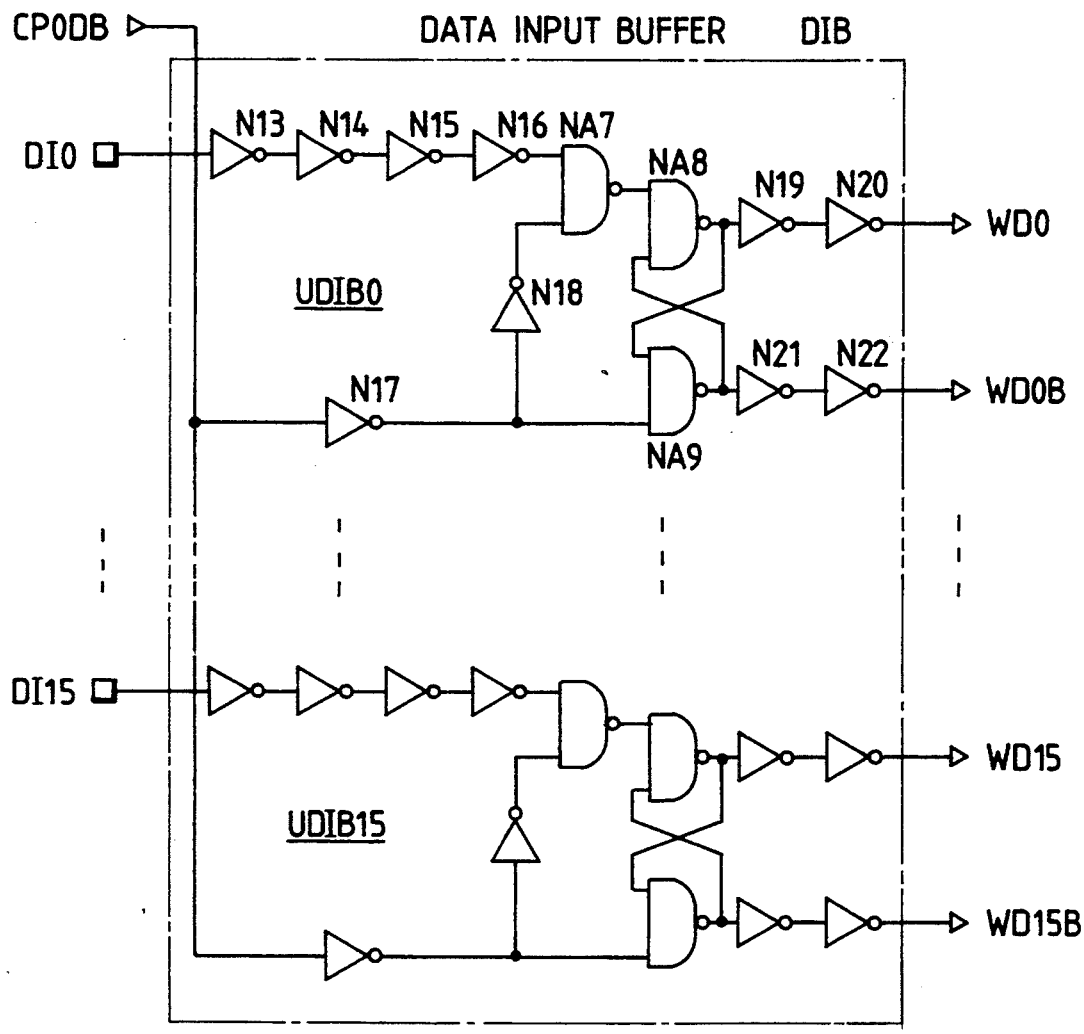

FIG. 14
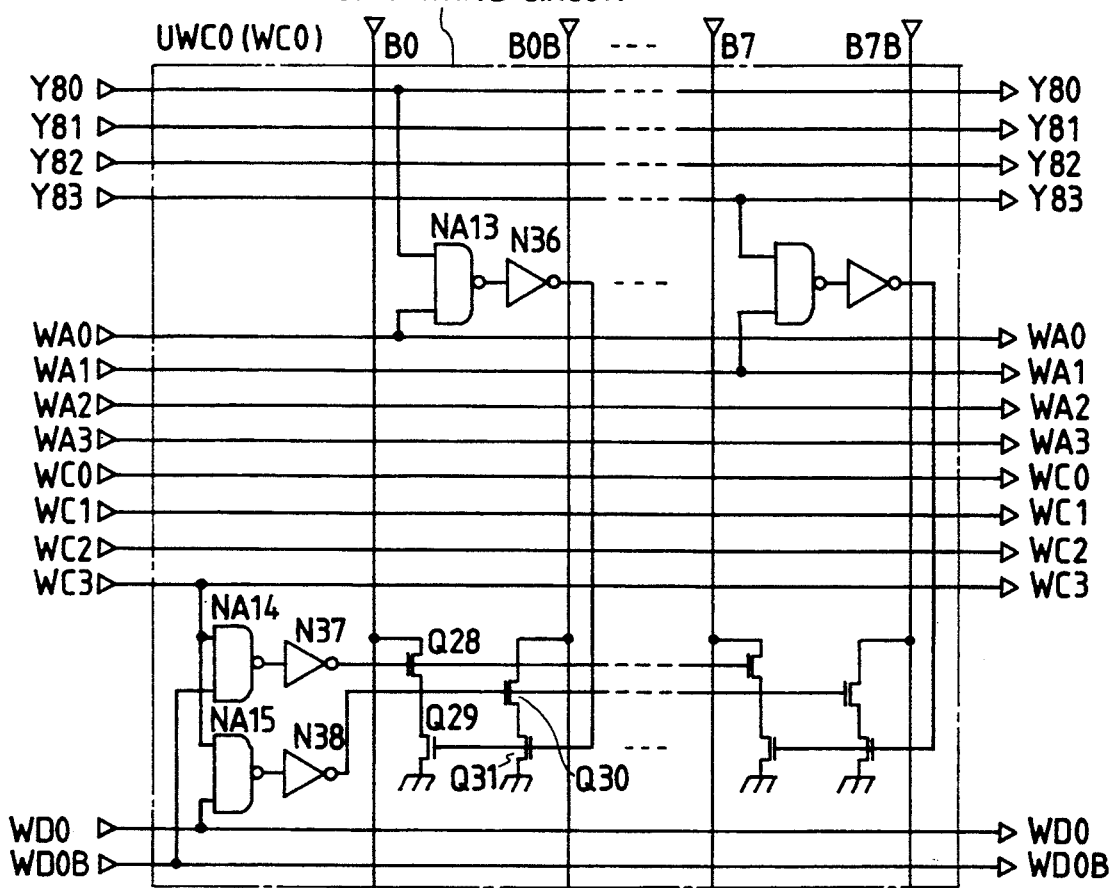
UNIT WRITE CIRCUIT
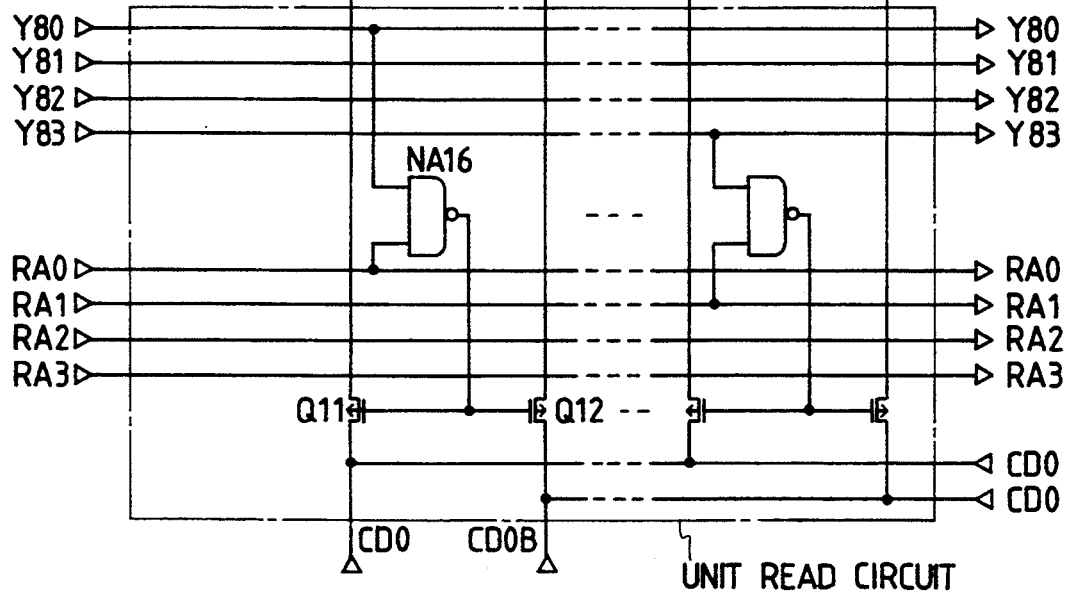
UNIT READ CIRCUIT

SEMICONDUCTOR STORAGE DEVICE

BACKGROUND OF THE INVENTION

The present invention relates to a semiconductor storage device and, more particularly, to a technology effective especially if used in a static RAM (i.e., Random Access Memory) which has a multi-bit structure and which is packaged as a speech pass memory or control memory in a digital switch integrated circuit of a time sharing digital converter.

Recently, digital switch integrated circuits have been developed which form the time switches of the time sharing digital converters such as found in ISDN (i.e., Integrated Service Digital Network). These digital switch integrated circuits have packaged therein multi-bit static RAMs to be used as the speech pass memories or control memories.

Such digital switch integrated circuits having the static RAMs packaged therein is disclosed, for example, on pp. 290 to 291 and 431 of "ISSCC Digest of Technical Papers" dated on Feb. 27, 1987. On the other hand, the array dividing system of the static RAM is disclosed, for example, in Japanese Patent Laid-Open No. 211393/1983 (i.e., Japanese Patent Publication No. 28516/1987) and Japanese Patent Laid-Open No. 72699/1984.

SUMMARY OF THE INVENTION

As the scale of the ISDN is enlarged, it becomes essential to increase the capacity of and reduce the power consumption of the speech pass memories and the control memories to be packaged in the digital switch integrated circuit. We have conceived to adopt the aforementioned array dividing system in the static RAMs to be used in those memories and have been confronted by the following problem. Specifically, the static RAM to be used in the speech pass memory and the control memory is required to have a multi-bit structure of 16 bits, for example, so that it is equipped with sixteen memory blocks corresponding to the individual bits of stored data. In ease, therefore, the memory array forming each memory block is to be divided into eight sub memory arrays, totally one hundred and twenty eight array selecting signals are provided for designating all the divided sub memory arrays selectively. It is needless to say that the array selecting signal lines for transmitting those array selecting signals are led a relatively long distance along the extending direction of the bit lines and are coupled to relatively high parasitic capacitors. As a result, the charge and discharge currents of the array selecting signal lines are increased with changes in the levels of the array selecting signals, so that the reduction of the power consumption of the static RAM is restricted.

Incidentally, the array dividing system for giving the main word lines themselves the array selecting function is disclosed, for example, in Japanese Patent Laid-Open No. 75996/1987.

A first object of the present invention is to provide an effective array dividing system which is freed from increasing the charge and discharge currents for the array selecting signal lines and the loads on the main word lines.

A second object of the present invention is to provide a multi-bit static RAM which is intended to reduce the power consumption without limiting the high operation of the RAM.

A third object of the present invention is to promote low power consumption and the high capacity of a digital switch integrated circuit having the static RAM packaged therein, and, accordingly, of a time sharing digital converter.

A fourth object of the present invention is to provide memory data writing and outputting methods suited for a static RAM or the like packaged in the digital switch integrated circuit.

A representative example of the invention to be disclosed therein will be briefly summarized in the following discussion. Specifically, the memory array of the static RAM or the like is divided in the word line extending direction into a plurality of sub memory arrays. Moreover, array selecting signals for selecting those sub memory arrays and sub word line selecting signals for selecting sub word lines are combined to form word line selecting signals selectively, and the word line selecting signal lines for selecting those word line selecting signals, i.e., main word lines, are arranged in parallel with the sub word lines. Moreover, a sub word line drive circuit is provided for bringing the corresponding sub word lines selectively into selected states by combining at least two bits of the word line selecting signals in a manner to correspond to the individual sub word lines.

According to the means described above, the sub word lines and the main word lines can be indirectly coupled through the sub word line drive circuit to lighten the loads upon the main word lines. Moreover, the charge and discharge currents of the main word lines, i.e., the array selecting signal lines, can be reduced by selectively forming the word line selecting signals corresponding to the sub word lines which are designated by combining the sub word line selecting signals and the array selecting signals. Still moreover, the sub word lines can be given a decoder function to expand the array selecting condition thereby to increase the number of array divisions. As a result, it is possible to promote not only the reduction of power consumption of the static RAM or the like without restricting the high speed operation of the RAM, but also to promote low power consumption and the high capacity of the digital switch integrated circuit including the static RAM, and, accordingly, the time sharing digital converter.

BRIEF DESCRIPTION OF THE DRAWINGS

FIG. 6 is a layout diagram showing the embodiment of the control memory of FIG. 3;

FIG. 8 is a circuit diagram showing a clock buffer and an address buffer contained in the control memory of FIG. 3;

FIG. 9 is a circuit diagram showing one embodiment of a read/write signal buffer and an input data buffer contained in the control memory of FIG. 3;

FIG. 14 is a circuit diagram showing a portion of one embodiment of a write circuit and a read circuit contained in the control memory of FIG. 3;

DESCRIPTION OF THE PREFERRED EMBODIMENTS

1. Summary of Digital Switch Integrated Circuit

Figure 1:
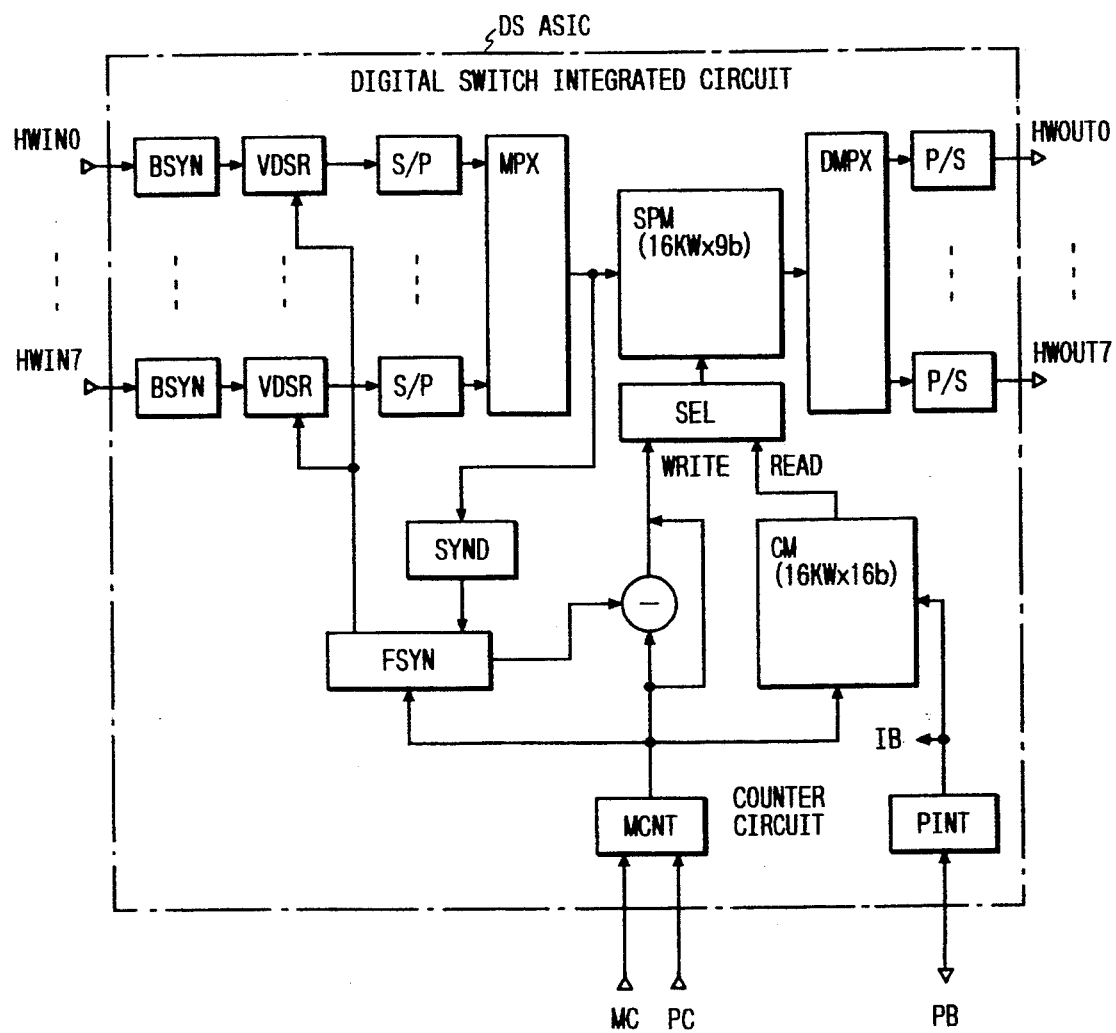
FIG. 1 is a block diagram showing one embodiment of a digital switch integrated circuit according to the present invention.
Figure 2:
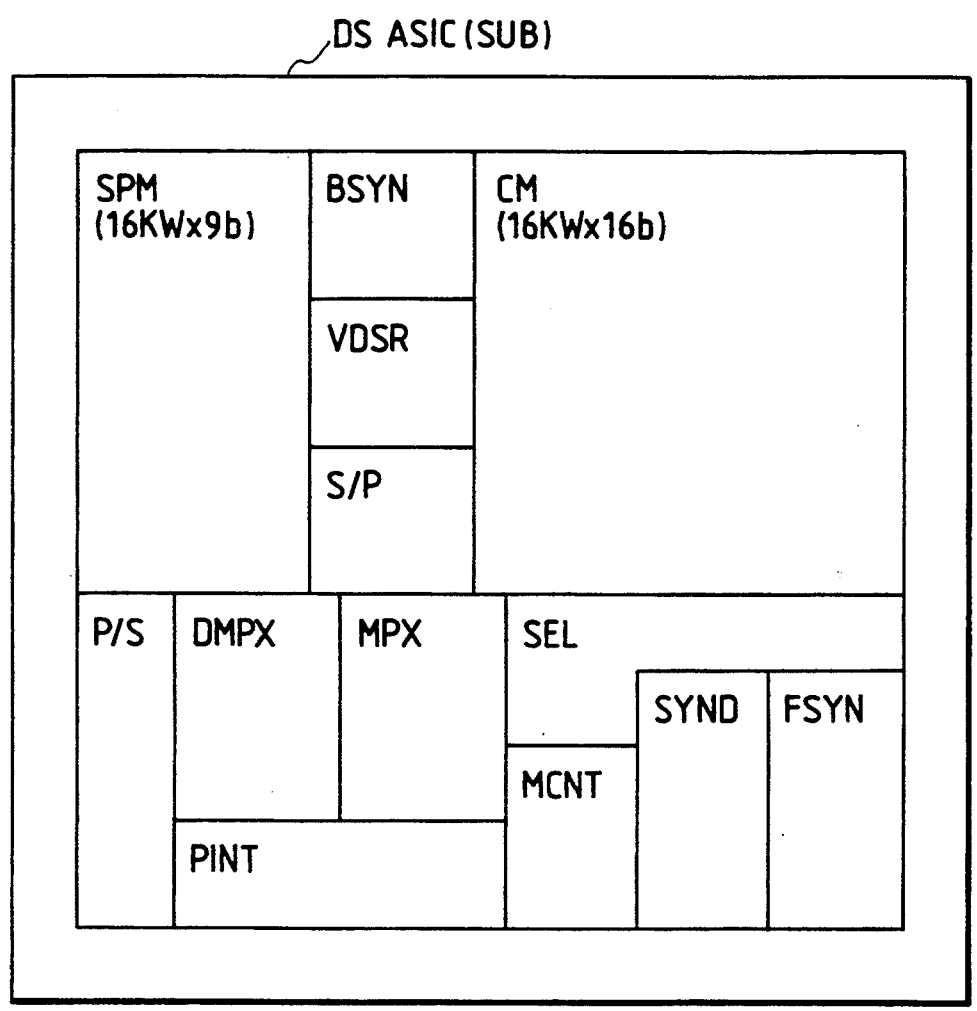
FIG. 2 is a substrate layout diagram showing the embodiment of the digital switch integrated circuit of FIG. 1.

FIG. 1 is a block diagram showing one embodiment of a digital switch integrated circuit (DS ASIC) according to the present invention. Moreover, FIG. 2 is a substrate layout diagram showing the embodiment of the digital switch integrated circuit of FIG. 1. With reference to these Figures, the digital switch integrated circuit of this embodiment will be summarized in the following discussion. Incidentally, the digital switch integrated circuit of this embodiment is used as a time switch in a time sharing digital converter of the ISDN. The circuit elements constituting the individual blocks of FIG. 1 are formed over a single semiconductor substrate of P-type single crystal silicon or the like. In the following circuit diagrams, a MOSFET (i.e., Metal Oxide Semiconductor Field Effect Transistor, as will represent all insulated gate field effect transistors) having its channel (or back gate) provided with an arrow belongs to a P-channel type, as is discriminated from an N-channel MOSFET having no arrow.

1.1. Block Structure of Digital Switch Integrated Circuit

As shown in FIG. 1, the digital switch integrated circuit of this embodiment includes eight bit synchronizing circuits BSYN and variable delay shift registers VDSR, which correspond to input highways HWIN0 HWIN7. A series of pulse signals. i.e., communication data to be inputted from the input highways HWIN0 to HWIN7 via their bit synchronous circuits and variable delay shift registers, are converted through corresponding series/parallel converters S/P into parallel signals of 8 bits, which are multiplexed by a multiplexer until they are sequentially written in a speech pass memory SPM. Incidentally, the writing and reading operations of the communication data in and from the speech pass memory SPM are accomplished by adding parity bits so that the reliability of the storage data is enhanced.

The speech pass memory SPM is fed with a write address from a step-by-step counter circuit and a read address from a control memory CM in accordance with a main clock MC and a frame clock FC. The write address outputted from the counter circuit MCNT is corrected by a subtraction circuit which is made receptive of an output signal of a frame synchronizing circuit FSYN, and the read address outputted from the control memory CM is rewritten from a processor bus PB via a processor interface circuit PINT on the basis of connection information. These write/read addresses are selectively transmitted in the first or second half to the speech pass memory SPM through an address selector SEL.

The communication data of 8 bits read in parallel from the speech pass memory SPM in accordance with the read address are de-multiplexed by a de-multiplexer DMPX and are then converted by parallel/series converters P/S into a series of pulses, which are sent out to corresponding output highways HWOUT0 to HWOUT7. As a result, the communication data inputted through the time slots designated as the write addresses of the input highways HWIN0 to HWIN7 are replaced by those of the time slots designated as the read addresses of the output highways HWOUT0 to HWOUT7 so that the digital switch integrated circuit functions as the so-called "time switch".

In this embodiment, the speech pass memory SPM is composed of a so-called "multi-bit static RAM" and has 16384, i.e., 16 KW (i.e., Kilo-Words) addresses corresponding to the individual time slots and nine data input/output terminals corresponding to the communication data of 8 bits and a parity signal of 1 bit. On the other hand, the control memory CM is similarly composed, as will be described later, of a multi-bit static RAM and has 16 KW addresses corresponding to the individual time slots and sixteen data input/output terminals corresponding to read addresses of fourteen bits and parity signals of 2 bits. The specific structure of the control memory CM will be described later in detail together with the operations and features thereof.

1.2. Chip Layout of Digital Switch Integrated Circuit

A plurality of blocks composing the digital switch integrated circuit are formed, as shown in FIG. 2, over a single semiconductor substrate SUB made of P-type single crystal silicon. Of these blocks, the speech pass memory SPM is arranged at a lefthand upper portion of the semiconductor substrate SUB (wherein the positional relations of each layout diagram designate the upper, lower, lefthand and righthand portions of the semiconductor substrate SUB), and the control memory CM is arranged at a righthand upper portion of the same. Between the speech pass memory SPM and the control memory CM, there are arranged the bit synchronizing circuit BSYN, the variable delay shift register VDSR and the series/parallel converter S/P. In the lower portion of the semiconductor substrate SUB, there are arranged the parallel/series converter circuit S/P, the de-multiplexer DMPX, the multiplexer MPX, the processor interface circuit PINT, the address selector SEL, the counter circuit MCNT, the synchronism detecting circuit SYND and the frame synchronizing circuit FSYN.

2. Summary of Control Memory

Figure 3:
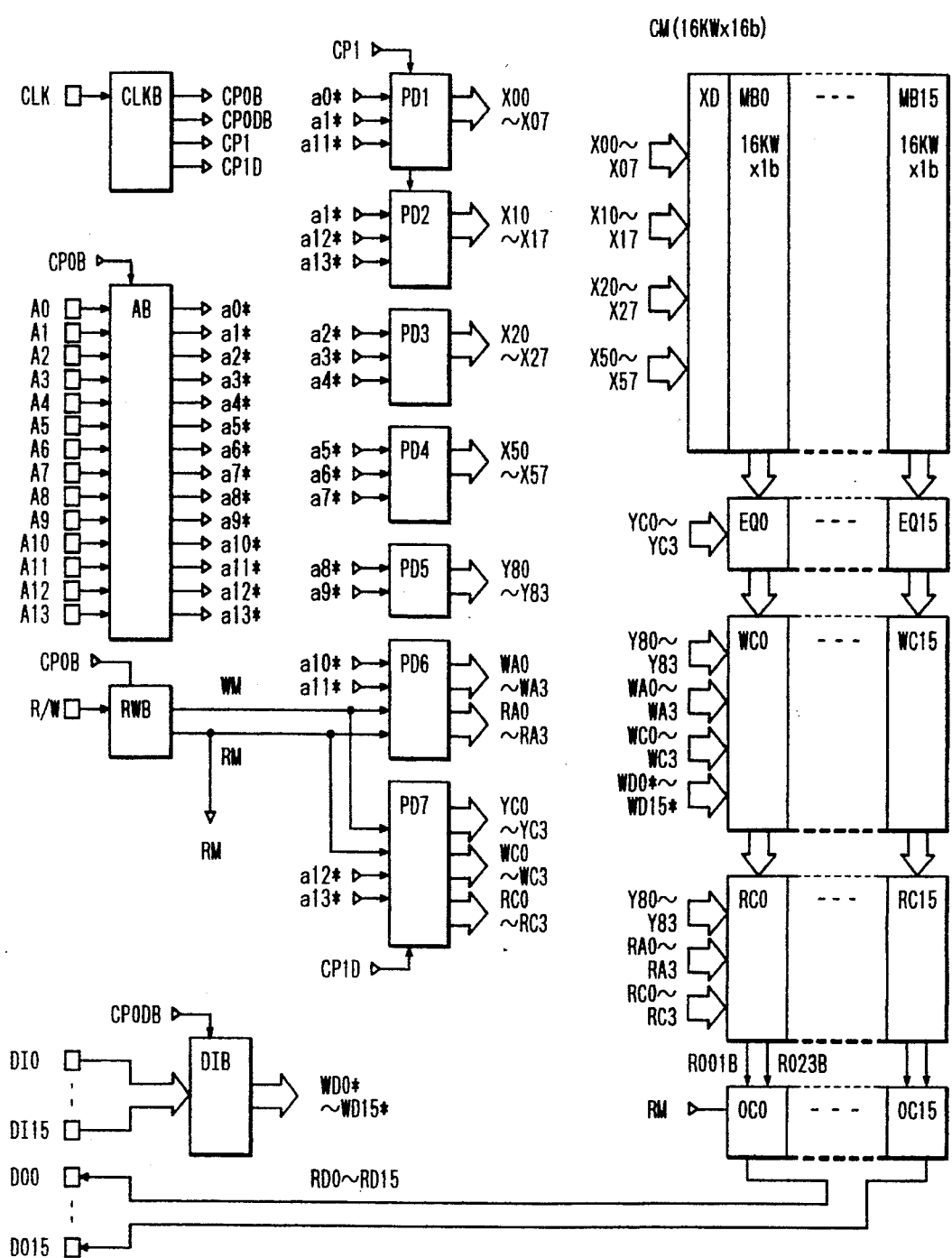
FIG. 3 is a block diagram showing one embodiment of a control memory contained in the digital switch integrated circuit of FIG. 1.
Figure 4:
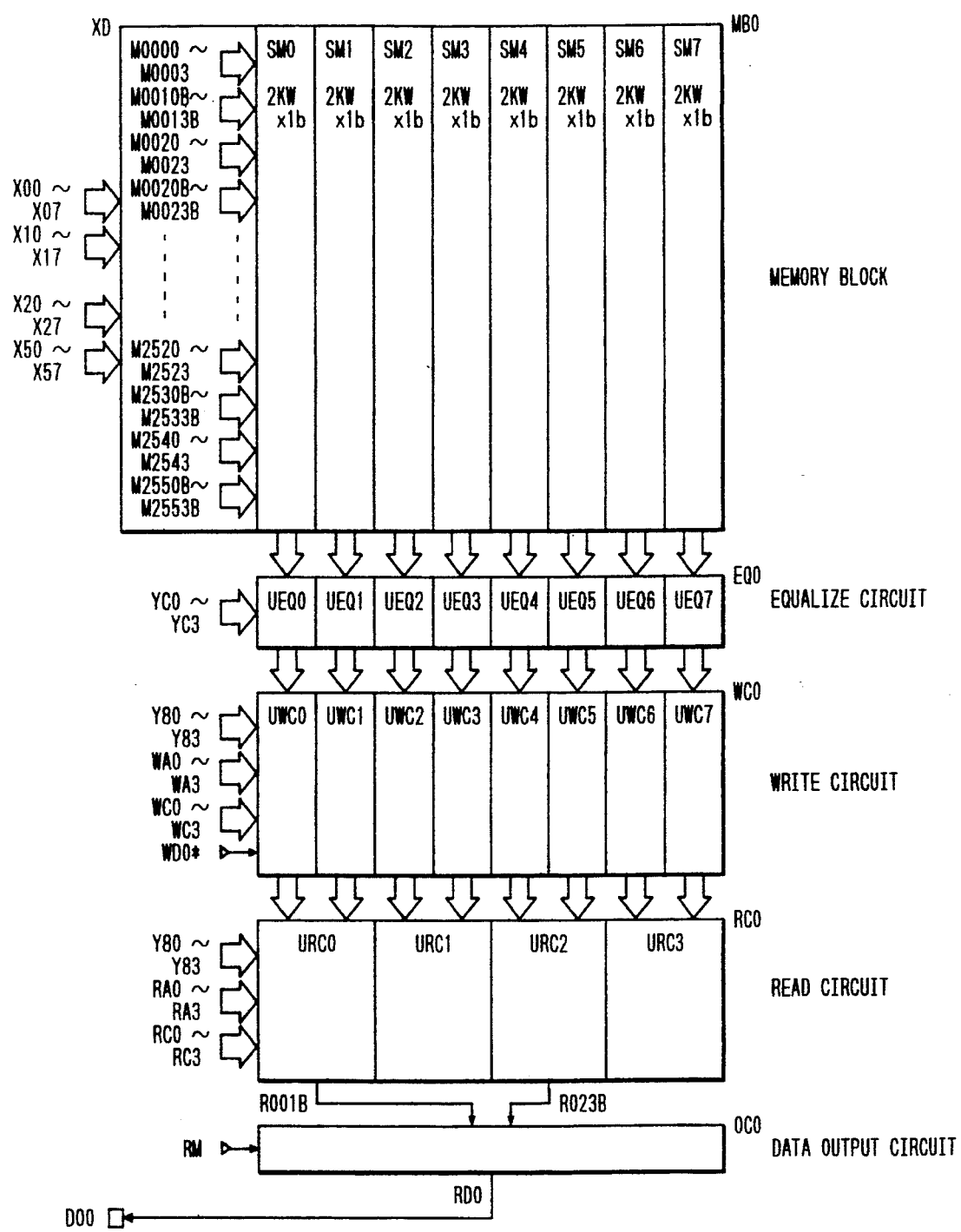
FIG. 4 is a block diagram showing one embodiment of a memory block contained in the control memory of FIG. 3.
Figure 5:
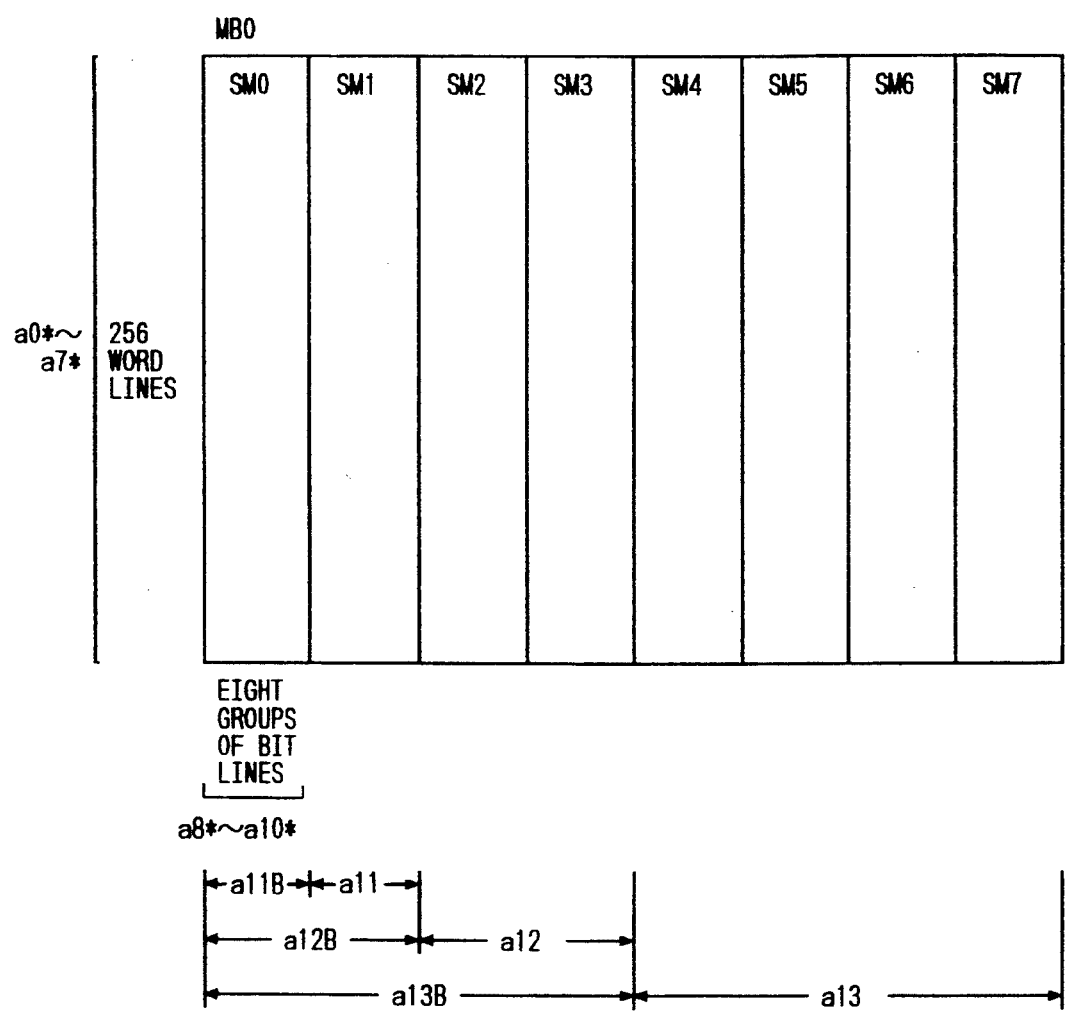
FIG. 5 is an address assignment diagram showing one embodiment of the memory block of FIG. 4.
Figure 7:
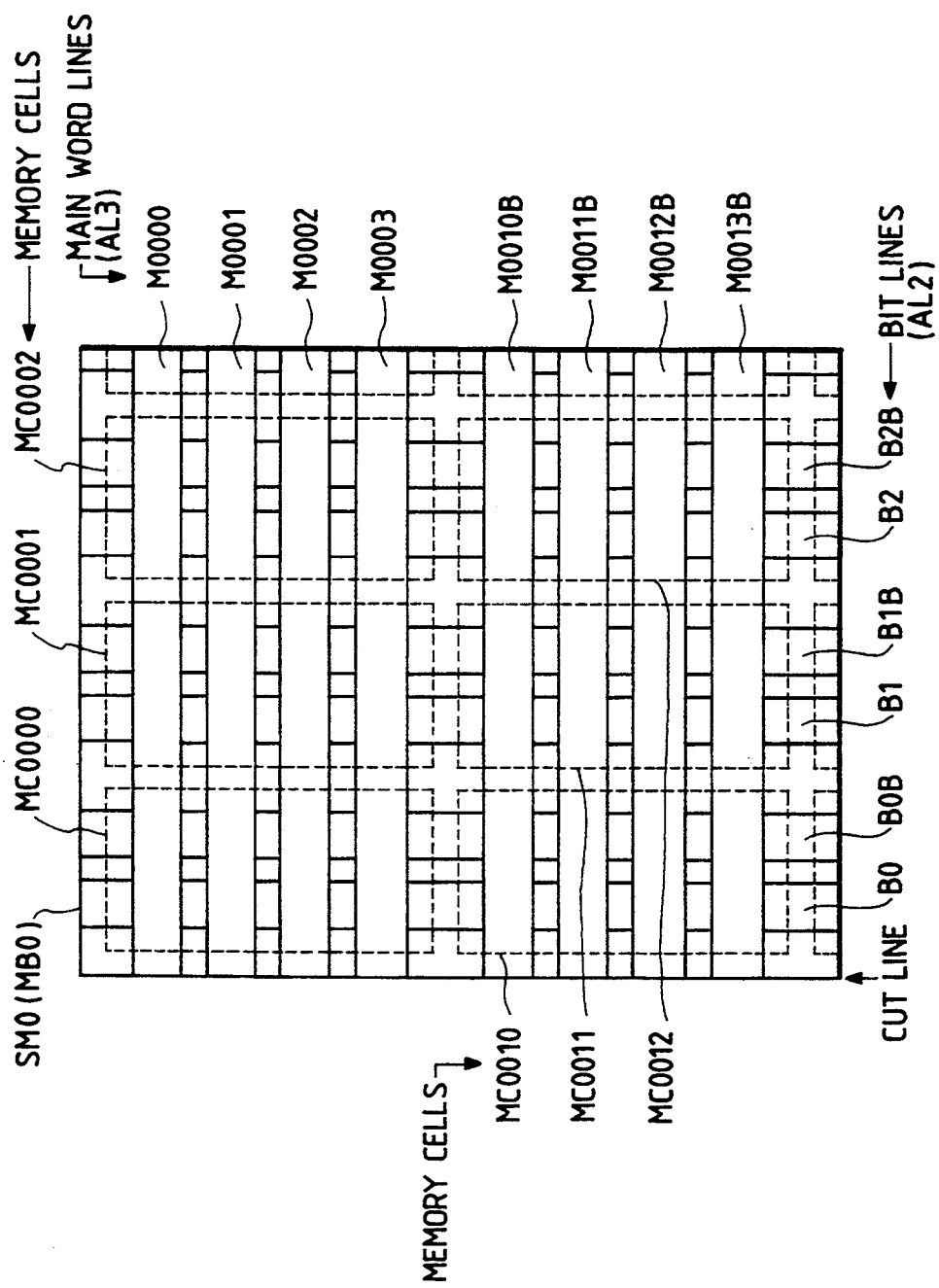
FIG. 7 is an enlarged layout diagram showing a portion of the embodiment of the control memory of FIG. 3.

FIG. 3 is a block diagram showing one embodiment of the control memory CM contained in the digital switch integrated circuit of FIG. 1. Moreover, FIG. 4 is a block diagram showing one embodiment of a memory block MB0 and its peripheral circuit, which are contained in the control memory CM of FIG. 8, and FIG. 5 is an address assignment diagram showing one embodiment of the memory block MB0 of FIG. 8. Still moreover, FIG. 6 is a layout diagram showing one embodiment of the control memory CM of FIG. 3, and FIG. 7 is an enlarged layout diagram showing a portion of the memory block MB0. With reference to these Figures, the control memory CM constituting the digital switch integrated circuit of this embodiment will be summarized in the following discussion. Incidentally, the speech pass memory SPM is made to have a structure similar to that of the control memory CM excepting that it has 9 bits.

2.1. Structure of Control Memory

As shown in FIG. 3, the control memory CM is basically composed of sixteen memory blocks MB0 to MB15 corresponding to storage data of 16 bits. Each of these memory blocks is divided in the word line extending direction into eight sub memory arrays SM0 to SM7. In this embodiment, each of the sub memory arrays SM0 to SM7 includes, as will be described hereinafter, 256 sub word lines, which are arranged in parallel in the horizontal direction of the same Figure and are selectively brought into a selected state, and eight sets of complementary data lines which are arranged in parallel in the vertical direction and are selectively brought into a selected state. These sub word lines and complementary bit lines have their intersections arranged in a lattice form with 256×8, i.e., 2,048 static memory cells. As a result, each of the sub memory arrays SM0 to SM7 is given a storage capacity of the so-called "2 KW×1 bits", and each of the memory blocks MB0 to MB15 is given a storage capacity of 16 KW×1 bit. The memory blocks MB0 to MB15 are simultaneously activated so that each of them has its one memory cell brought into the selected state. As a result, the control memory CM of this embodiment has a storage capacity of 16 KW×16 bits.

The 256 sub word lines constituting the sub memory arrays SM0 to SM7 of the memory blocks MB0 to MB15 are individually coupled to the corresponding sub word line drive circuits. These sub word line drive circuits are basically composed of substantially two-input logic gates which have one of their input terminals coupled individually to main word lines (or word line selecting signal lines) M0000–M0003 to M2540–M2543 of corresponding main word line groups (or word line selecting signal line groups) and the other of their input terminals coupled to inverted main word lines M0010B–M0013B to M2550B–M2553B (wherein the so-called "inverted signals" or "inverted signal lines" to be selectively set to a low level, if effective, will have their names subscribed by B). The main word lines M0000–M0003 to M2540–M2543 and the inverted main word lines M0010B–M0013B to M2550B–M2553B are selectively set to the high or low level by combining them with predecode signals X00–X07 to X50–X57 in an X-decoder XD.

On the other hand, the eight sets of complementary bit lines composing the sub memory arrays SM0 to SM7 of the memory blocks MB0 to MB15 are coupled through corresponding unit equalize circuits UEQ0 to UEQ7 of equalize circuits EQ0 to EQ15 to corresponding unit write circuits UWC0 to UWC7 of write circuits WC0 to WC15, and further coupled to corresponding unit read circuits URC0 to URC15 of read circuits RC0 to RC15.

Of these circuits, two adjoining ones of the unit equalize circuits UEQ0 to UEQ7 of the individual equalize circuits are selectively and simultaneously brought into operative states in accordance with predecode signals YC0 to YC3 to equalize the non-inverted and inverted signal lines of the totally sixteen sets of corresponding complementary bit lines to a predetermined precharge level. On the other hand, the unit write circuits UWC0 to UWC7 of the individual write circuits are selectively brought into operative states in accordance with the predecode signals WC0 to WC3 to thereby feed a predetermined write signal according to a complementary write signal WC0* (wherein the non-inverted write signal WD0 and the inverted write signal WD0B are designated together at the "complementary write signal WD0*" by adding the symbol "*" to them) to one memory cell designated by predecode signals Y80 to Y83 and WA0 to WA3 of the corresponding sub memory arrays. Moreover, the unit read circuits URC0 to URC3 of each read circuit are selectively brought into operative states in accordance with the predecode signals RC0 to RC3 to amplify the read signals to be output from one memory cell designated by the predecode signals Y80 to Y83 and RA0 to RA3 of corresponding two sub memory arrays SM0 and SM1 to SM6 and SM7. These read signals have their OR taken between the adjoining two unit read circuits URC0 and URC1 to URC2 and URC3 and are then transmitted as inverted read signals R001B and R023B to the corresponding data output circuits OC1 to OC15 and are outputted as read data RD0 to RD15 from the corresponding data output terminals CO0 to DO15.

Turning to FIG. 3, the control memory CM is fed with a clock signal CLK and a read/write signal R/W acting as start control signals via its corresponding input terminals, and further with address signals A0 to A13 of 14 bits for designating the addresses of 16 KW selectively via its corresponding address input terminals. Moreover, the control memory CM is fed with write data DI0 to DI15 of 16 bits via its corresponding data input terminals and further with read data DO0 to DO15 of 16 bits via its corresponding data output terminals. Of these signals, the clock signal CLK is inputted to a clock buffer CLKB, and the read/write signal R/W is inputted to a read/write signal buffer RWB. Moreover, the address signals A0 to A13 are inputted to an address buffer AB, and the write data DI0 to DI15 are inputted to an input data buffer DIB.

The clock buffer CLKB produces inverted internal clock signals CP0B and CP0DB and internal clock signals CP1 and CP1D on the basis of the clock signal CLK and feeds them to the read/write signal buffer RWB, the address buffer AB, the input data buffer DIB and predecoders PD1, PD2 and PD7. On the other hand, the read/write signal buffer RWB Fetches the read/write signal R/W in accordance with the inverted internal clock signal CP0B and produces internal control signals RM and WM selectively on the basis of them. These internal control signals RM and WM are fed to predecoders PD6 and PD7. The internal control signal RM is also fed to data output circuits OC0 to OC15. On the other hand, the address buffer AB fetches the address signals A0 to A13 in accordance with the inverted internal clock signal CP0B and produces complementary internal address signals a0* to a13* on the basis of them. These complementary internal address signals are then fed in a predetermined combination to predecoders PD0 to PD7. Moreover, the input data buffer DIB fetches the write data DI0 to DI15 in accordance with the inverted internal clock signal CP0DB and produces complementary write signals WD0* to WD15* on the basis of them. These complementary write signals are individually fed to the corresponding write circuits WC0 to WC15.

Next, the predecoder PD1 is selectively rendered operative in accordance with the internal clock signal CP1 to decode the complementary internal address signals a0*, a1* and a11*, thereby to set the predecode signals X00 to X07 of 8 bits selectively to the high level. Likewise, the predecoder PD2 is selectively rendered operative in accordance with the internal clock signal CP1 to decode the complementary internal address signals a1*, a12* and a13*, thereby to set predecode signals X10 to X17 of 8 bits selectively to the high level. Moreover, the predecoder PD3 is steadily rendered operative to decode the complementary internal address signals a2* to a4*, thereby to set predecode signals X20 to X27 of 8 bits selectively to the high level. Likewise, the predecoder PD4 is steadily rendered operative to decode the complementary internal address signals a5* to a7*, thereby to set predecode signals X50 to X57 of 8 bits selectively to the high level. The predecode signals X00-X07 to X50-X57 are fed, as has been described hereinbefore, to the X-decoder XD so that they are used For the selecting operations of the main word lines and the sub word lines.

On the other hand, the predecoder PD5 is steadily rendered operative to decode the complementary internal address signals a8* and a9*, thereby to set the predecode signals Y80 to Y83 of 4 bits selectively to the high level. Likewise, the predecoder PD6 is steadily rendered operative to set the predecode signals WA0 to WA3 or RA0 to RA3 of 4 bits selectively to the high level in accordance with the complementary internal address signals a10* and a11* and the internal control signals WM and RM. Moreover, the predecoder PD7 is selectively rendered operative in accordance with the internal clock signal CP1D to set the predecode signals YC0 to YC3, WC0 to WC3, or RC0 to RC3 of 4 bits selectively in accordance with the complementary internal address signals a12* and a13* and the internal control signals WM and RM. The predecode signals Y80 to Y83 are fed to the write circuits WC0 to WC15 and the read signals RC0 to RC15, and the predecode signals YC0 to YC3 are fed to the equalize circuits EQ0 to EQ15. On the other hand, the predecode signals WA0 to WA3 and WC0 to WC3 are fed to the write circuits WC0 to WC15, and the predecode signals RA0 to RA3 and RC0 to RC3 are fed to the read circuits RC0 to RC15.

2.2. Address Assignment of Control Memory

The control memory CM has a storage capacity of 16 KW×16 bits, as has been described herein-before, and is equipped with sixteen memory blocks MB0 to MB15 corresponding to the storage data of 16 bits. These memory blocks are individually given the storage capacity of 16 KW×1 bit and are simultaneously activated at all times. In other words, the control memory CM has an address space extended only in each memory block, and the address signals A0 to A13 of 14 bits are used to designate the addresses in each memory block selectively.

Specifically, the memory block MB0 will be described by way of example. The two hundreds and fifty six sub word lines of the sub memory arrays SM0 to SM7 are selectively designated, as shown in FIG. 5, in accordance with the complementary internal address signals A0* to a7* of less significant 8 bits, and the eight sets of complementary bit lines are selectively designated in accordance with the complementary internal address signals a8* to a10* of more significant 3 bits. The eight sub memory arrays SM0 to SM7 of each memory block are selectively designated in accordance with the complementary internal address signals a11* to a13* of the remaining 3 bits. In this embodiment, the two hundred and fifty six sub word lines composing the sub memory arrays SM0 to SM7 are divided into groups of four lines, as will be reasoned, to form totally sixty four sets of sub word groups. These sub word line groups are selectively designated in accordance with the complementary internal address signals a2* to a7* of 6 bits, and the four sub word lines in each sub word group are selectively designated in accordance with the complementary internal address signals a0* and a1* of 2 bits.

In this embodiment, moreover, by combining row address signals of 2 bits, i.e., the complementary internal address signals a0* and a1* for selectively designating the four sub word lines constituting each sub word line group and column address signals of 3 bits, i.e., the complementary address signals a11* to a13* used for the array selections, two sets, i.e., eight main word lines M0000 to M0003 and the inverted main word lines M0010B to M0013B, or the main word lines M2540 to M2543 and the inverted main word lines M2550B to M2553B, which are provided to correspond to the two adjoining sub word lines, are selectively set to the high or low level. These main word lines and inverted main word lines are fed in a predetermined combination to the sub word line drive circuits corresponding to the individual sub word lines so that the total of sixteen sub word lines of the sub memory arrays SM0 to SM7 are selectively brought into the selected states. In short, in the control memory CM of this embodiment, the array selecting signals to be produced on the basis of the complementary internal address signals a11* to a13* are transmitted via the main word lines, which are arranged substantially in parallel with the sub word lines, so that no array selecting signal line is present in parallel with the bit lines.

2.3. Layout of Control Memory

The control memory CM is equipped, as has been described hereinbefore, with the sixteen memory blocks MB0 to MB15 corresponding to the storage data of 16 bits. Of these, as shown in FIG. 6, the eight memory blocks MB0 to MB7 are arranged at the lefthand side of the X-decoder XD, and the remaining eight memory blocks MB8 to MB15 are arranged at the righthand side of the X-decoder XD. At the lower side of the memory blocks MB0 to MB7, there are sequentially arranged the corresponding equalize circuits EQ0 to EQ7, write circuits WC0 to WC7, read circuits RC0 to RC7 and data output circuits OC0 to OC7. At the lower side of the memory blocks MB8 to MB15, there are sequentially arranged the corresponding equalize circuits EQ8 to EQ15, write circuits WC8 to WC15, read circuits RC8 to RC15 and data output circuits OC8 to OC15. At the lower side of the X-decoder XD, there are arranged the predecoders PD1 to PD7, the clock buffer CLKB, the address buffer AB, the read/write buffer RWB and the input data buffer DIB. The main word lines M0000–M0003 to M2540–M2543 and the inverted main word lines M0010B–M0013B to M2550B–M2553B using the X-decoder as their output terminals are arranged to extend through the memory block MB0–MB7 and MB8–MB15, which are arranged at the two sides of the X-decoder XD.

2.4. Layout of Main Word Lines

The memory cells constituting the sub memory arrays SM0 to SM7 of the memory blocks MB0 to MB15, as represented by the memory cells MC0000 to MC0002 and MC0010 to MC0012 off FIG. 7, are laid out in the so-called "vertically elongated manner". Over these memory cells, there are arranged vertically in parallel the complementary bit lines B0* to B2* which are made of a second aluminum wiring layer (i.e., a metal wiring layer) AL2. Over these bit lines, there are arranged horizontally in parallel the main word lines M0000 to M0003 and the inverted main word lines M0010B to M0013B, which are made of a third aluminum wiring layer AL3. Between the individual complementary bit lines and the memory cells, there are arranged the not-shown sub word lines which are made of a gate material such as poly-silicon. In short, in the control memory CM of this embodiment, two sets, i.e., eight main word lines and inverted main word lines are provided in a manner to correspond to the two adjoining sub word lines, as has been described hereinbefore. Since the memory cells are vertically elongated, the four main word lines or inverted main word lines can be arranged in the layout area of one memory cell so that the layout area required by the control memory CM is not increased by providing the plurality of main word lines.

3. Structures and Features of Individual Portions Control Memory

Figure 10:
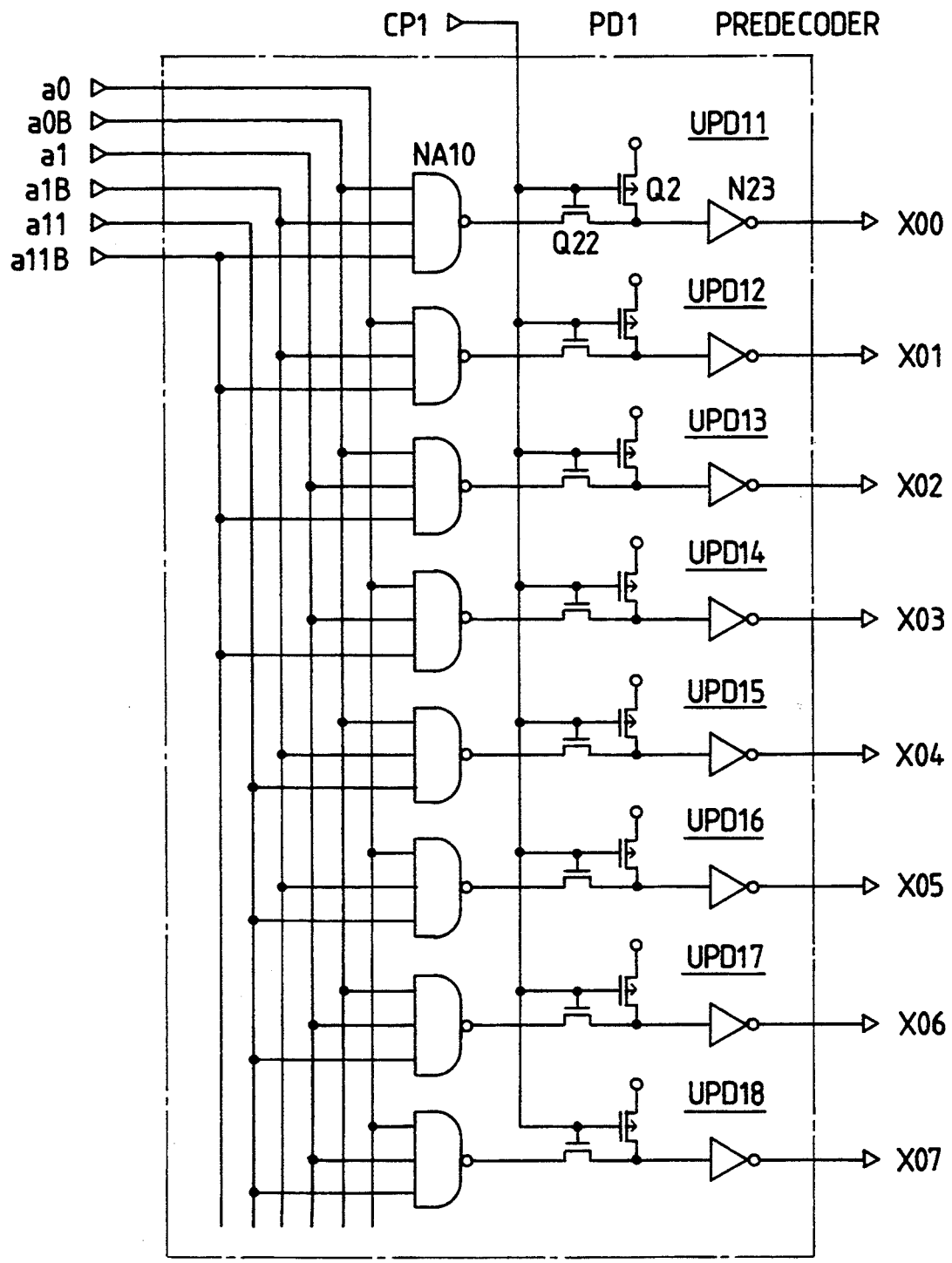
FIG. 10 is a circuit diagram showing one embodiment of a first predecoder contained in the control memory of FIG. 3.
Figure 11:
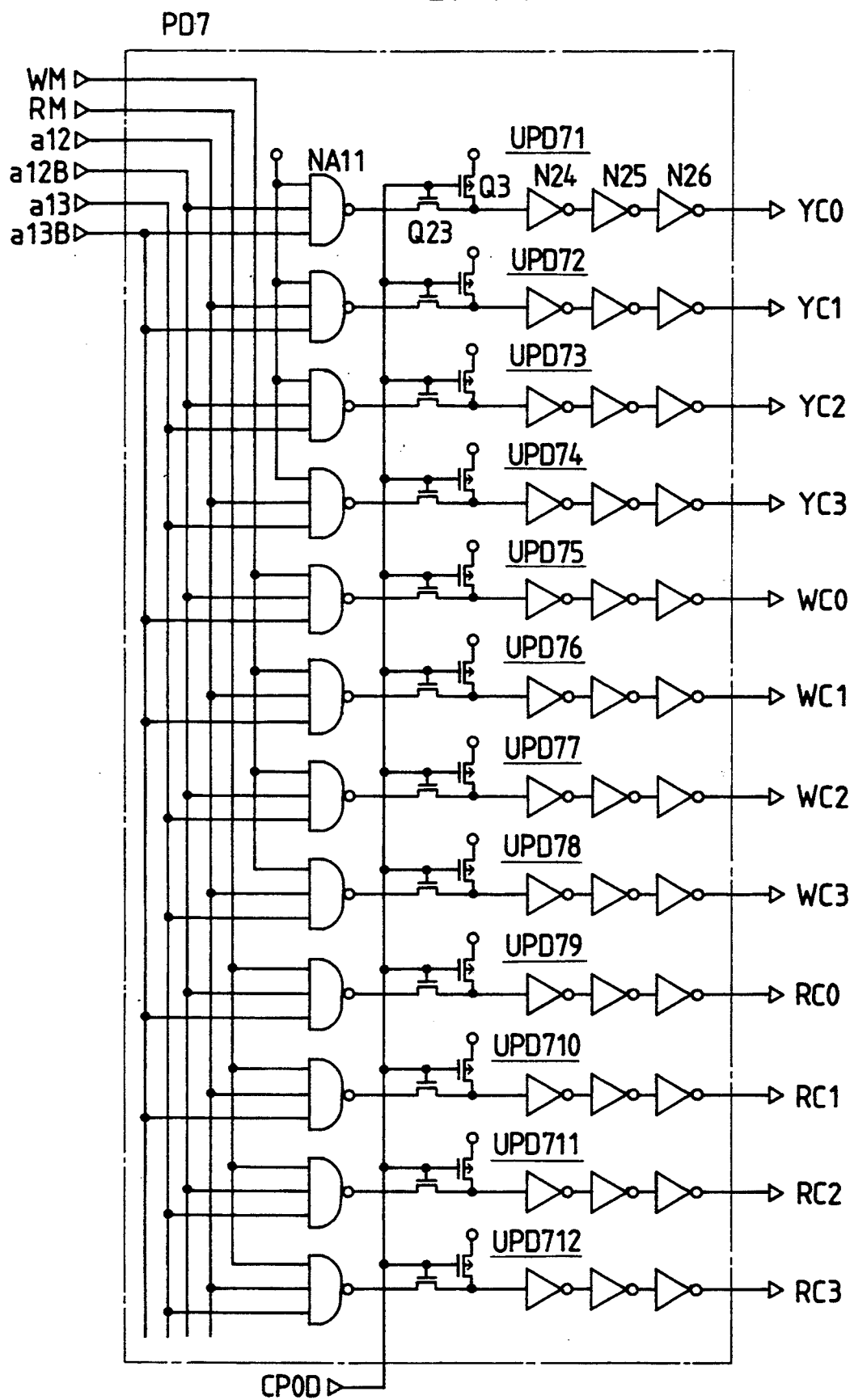
FIG. 11 is a circuit diagram showing one embodiment of a seventh predecoder contained in the control memory of FIG. 3.
Figure 12:
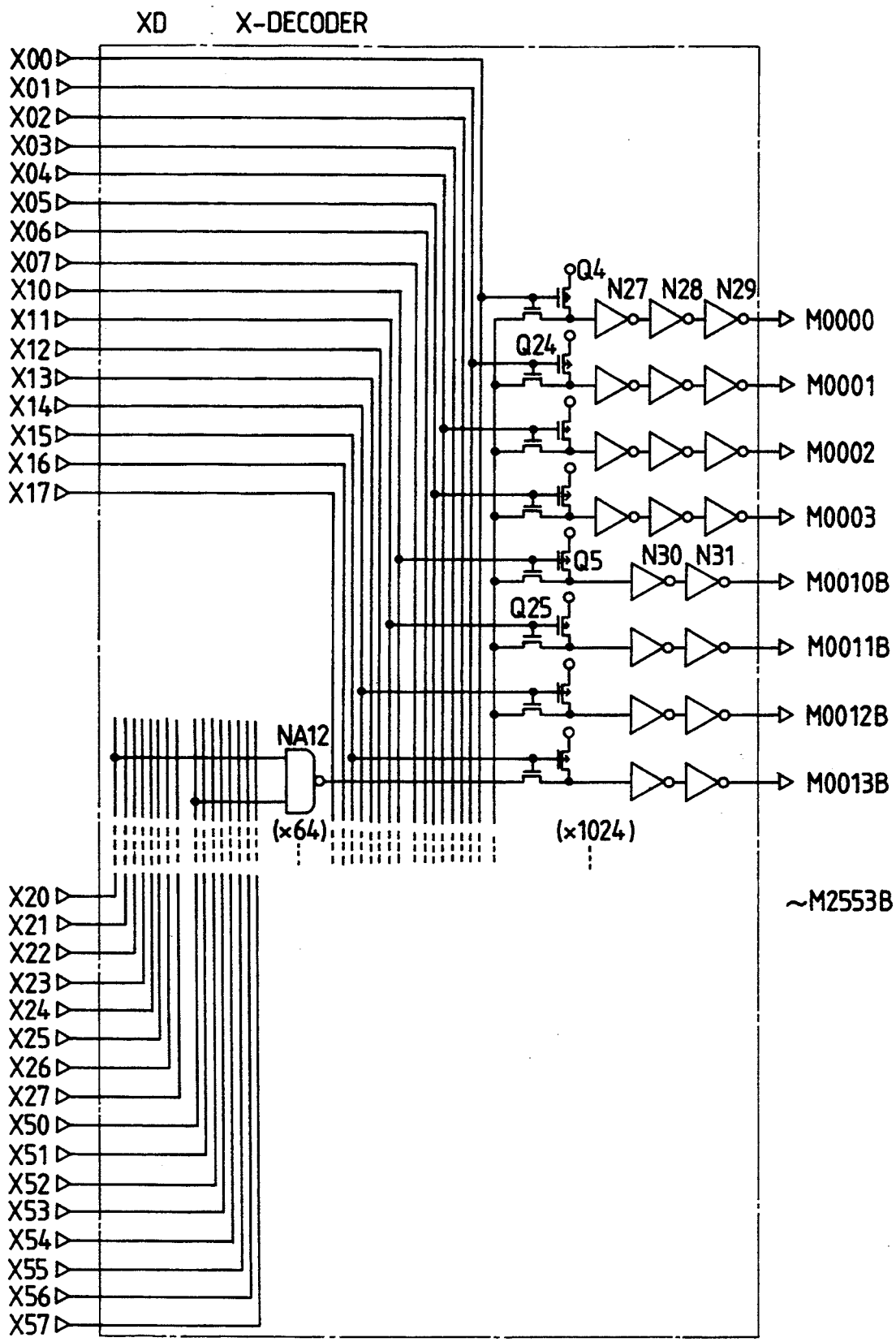
FIG. 12 is a circuit diagram showing a portion of one embodiment of an X-decoder contained in the control memory of FIG. 3.
Figure 13:
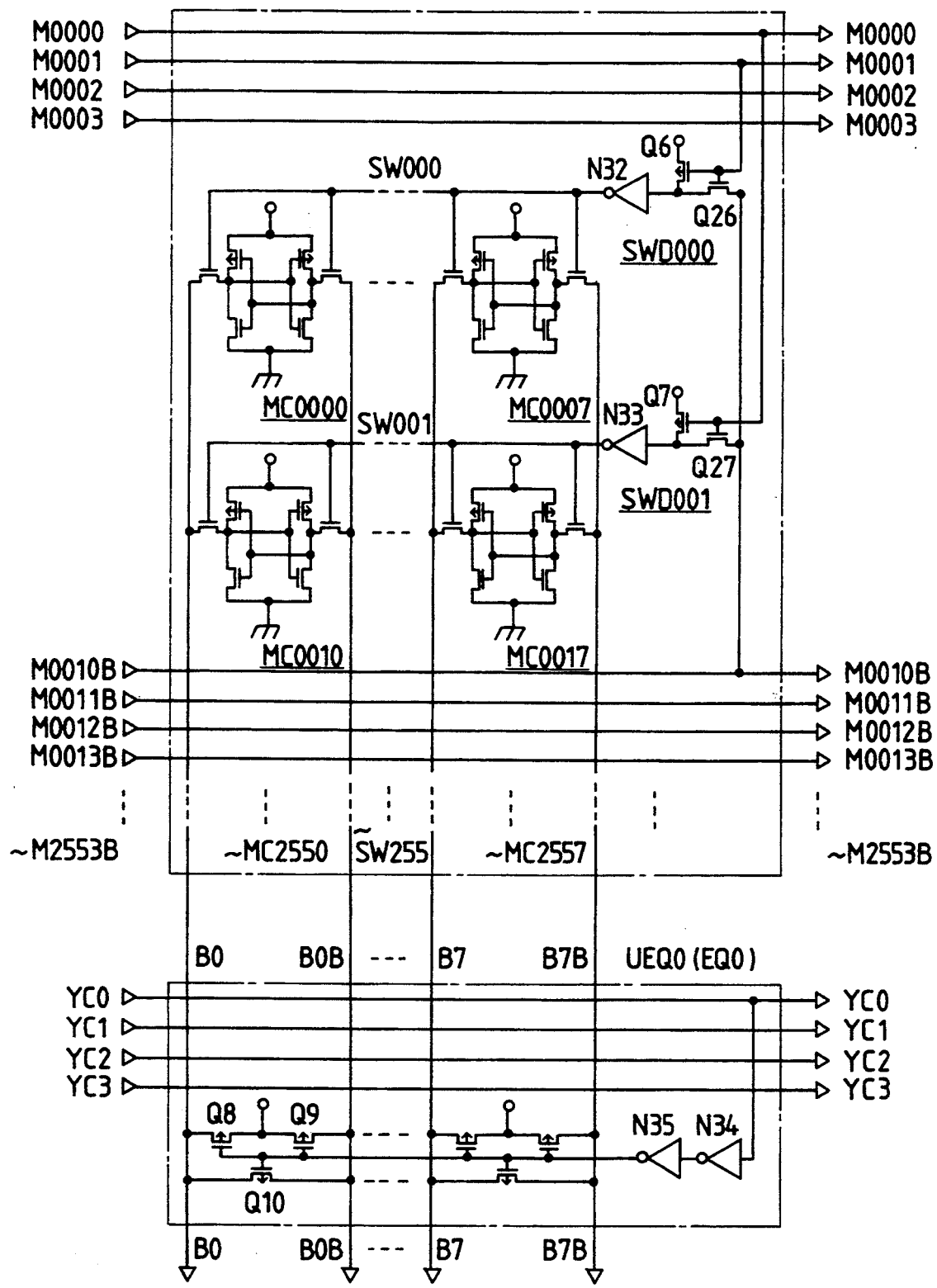
FIG. 13 is a circuit diagram showing a portion of one embodiment of a memory block and an equalize circuit contained in the control memory of FIG. 3.
Figure 15:
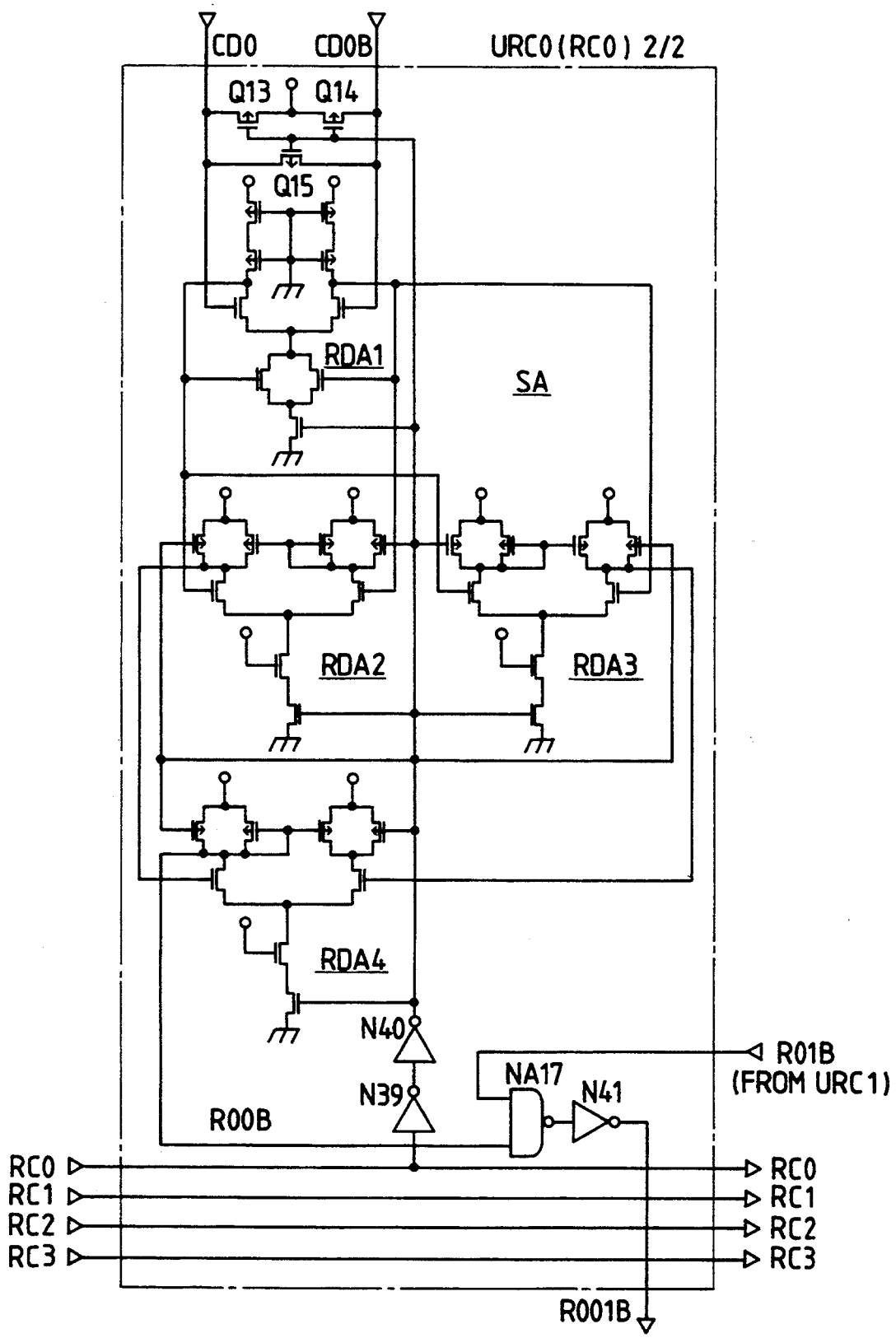
FIG. 15 is a circuit diagram showing a portion of the embodiment of the read circuit contained in the control memory of FIG. 3.
Figure 16:
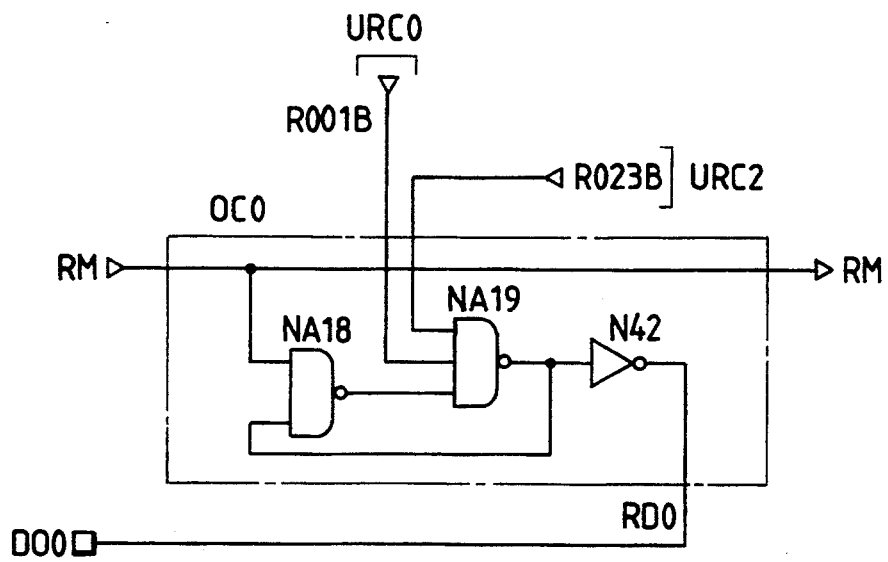
FIG. 16 is a circuit diagram showing a portion of one embodiment of a data output circuit contained in the control memory of FIG. 3.

FIG. 8 is a circuit diagram showing one embodiment of the clock buffer CLKB and the address buffer AB contained in the control memory CM of FIG. 8, and FIG. 10 is a circuit diagram showing one embodiment of the read/write signal buffer RWB and the input data buffer DIB. On the other hand, FIGS. 10 and 11 are individual circuit diagrams showing one embodiment of the predecoders PD1 and PD7 contained in the control memory CM of FIG. 8, and FIG. 12 is a circuit diagram showing a portion of one embodiment of the X-decoder XD. Moreover, FIG. 13 is a circuit diagram showing a portion of one embodiment of the memory block MB0 and the equalize circuit EQ0 which are contained in the control memory CM of FIG. 3. FIGS. 14, 15 and 16 are circuit diagrams showing portions of one embodiment of the write circuit WC0, the read circuit RC0 and the data output circuit OC0. With reference to these Figures, the specific structures of the individual portions of the control memory CM of this embodiment will be described together with a summary of the features of their operations.

3.1. Input Buffer

The control memory CM is equipped with four kinds of input buffers, i.e., the clock buffer CLKB, the address buffer AB, the read/write signal buffer RWB and the input data buffer DIB. Of these buffers, as shown in FIG. 8, the clock buffer CLKB includes a NAND gate NA3 having its one input terminal made receptive of the clock signal CLK. The other input terminal of the NAND gate NA3 is fed with the inverted output signal of a latch circuit which is constructed by connecting one input terminal and one output terminal of NAND gates NA1 and NA2 crossly to each other. The other input terminal of the NAND gate NA1 constituting the latch circuit is fed with a delay signal which is produced from the clock signal CLK by inverters N1 and N2. The other input terminal of the NAND gate NA2 is fed with a delay signal produced from the output signal of the NAND gate NAB by inverters N6 and N7 and a logic gate which is composed of a P-channel MOSFET Q1 and an N-channel MOSFET Q21. The output signals of the inverter N2 is converted through an inverter N3 into the inverted internal clock signal CP0B and through inverters N4 and N5 into an inverted internal clock signal CP0DB. Likewise, the output signal of the inverter N6 is converted into the internal clock signal CP1 and through inverters N8 and N9 into the internal clock signal CP1D.

From these, the inverter internal clock signal CP0B is a clock signal which is produced by delaying and inverting the clock signal CLK For a relatively short delay time by the inverters N1 to N3. The inverted internal clock signal CP0DB is a clock signal which is produced by delaying the aforementioned inverted internal clock signal CP0B For a predetermined delay time by the inverters N4 and N5. On the other hand, the internal clock signal CP1 is a clock signal which has its rise delayed From the rise of the clock signal CLK by a predetermined delay time of the NAND gate NA3 and the inverter N8 and its breakage set automatically from the rise of the clock signal CLK by the delay time of the logic gate and the NAND gates NA2 and NA1. It is needless to say that the internal clock signal CP1D is a clock signal which is further delayed from the aforementioned internal clock signal CP1 by a predetermined delay time of the inverters N8 and N9.

Next, the address buffer AB is equipped with fourteen unit address buffers UAB0 to UAB13 which correspond to the address signals A0 to A13. Each of these unit address buffers, as represented by the unit address buffer UAB0 of FIG. 8, includes the NAND gate NA4 which has its one input terminal made receptive of the corresponding address signals A0 to A13. The other input terminal of a NAND gate NA4 is fed through inverters N10 and N11 with the inverted internal clock signal CP0B. The output signal of the NAND gate NA4 is fed to the other input terminal of a NAND gate NA5 which constitutes a latch circuit together with a NAND gate NA6. The other input terminal of the NAND gate NA6 is fed with the output signal of the aforementioned inverter N10. The output signal of the NAND gate NA5 is converted into the non-inverted internal address signals a0 to a13 and further, through an inverter N12, into inverted internal address signals a0B to a13B.

As a result, when the control memory CM is brought into an unselected state so that the inverted internal clock signal CP0B is set to the high level, both the NAND gates NA4 and NA5 are rendered transmissive to transmit the address signals A0 to A13 as they are as the complementary internal address signals a0* to A13*. When the control memory CM is brought into a selected state so that the inverted internal clock signal CP0B is set to the low level, the NAND gate NA4 is rendered not to be transmissive so that the latch circuit composed of the NAND gates NA5 and NA6 is brought into a latching state while holding the logic level of the address signals A0 to A13 immediately before. As a result, the complementary internal address signals a0* to a13* become substantially valid to start the selecting operation of the control memory CM while shielding the noises to be superposed later on the address signals A0 to A13.

The read/write signal buffer RWB includes, as shown in FIG. 9, a single unit buffer which has the same circuit structure as that of the unit address buffers UAB0 to UAB13 of the address buffer AB. This unit buffer fetches the read/write signal R/W in accordance with the inverted internal clock signal CP0B and sets the internal control signals RM and WM selectively on the basis of the read/write signal R/W. It is needless to say that the internal control signal RM is selectively set to the high level, when the read/write signal R/W is set to the high level so that the control memory CM is bought into the read mode, and that the internal control signal WM is selectively set to the high level when the read/write signal R/W is set to the low level so that the control memory CM is brought into the write mode.

On the other hand, the input data buffer DIB is equipped with sixteen unit input data buffers UDIB0 to UDIB15 corresponding to the write data DI0 to DI15. Each of these unit input data buffers, as represented by a unit input data buffer UDIB0 of FIG. 9, includes an inverter N13 made receptive of the corresponding write data DI0 to DI15. The output signal of the inverter N13 is fed to one input terminal of the NAND gate NA7 through three inverters N14 to N16 which are connected in series. The other input terminal of the NAND gate NA7 is fed with the inverted internal clock signal CP0DB through inverters N17 and N18. The output signal of the NAND gate NA7 is fed to the other input terminal of the NAND gate NA8 which constitutes the latch circuit together with the NAND gate NA9. The other input terminal of the NAND gate NA9 is fed with the output signal of the aforementioned inverter N17. The output signal of the NAND gate NA8 is converted through inverters N19 and N20 into non-inverted write signals WD0 to WD15, and the output signal of the NAND gate NA9 is converted through inverters N21 and N22 into the inverted write signals WD0B to WD15B.

As a result, the write data DI0 to DI15 are latched by a latch circuit, which is composed of the NAND gates NAB and NA9 of the corresponding unit input data buffer, when the control memory CM is rendered selective to set the inverted internal clock signal CP0DB to the low level, until they are transmitted as the complementary write signals WD0* to WD15* to the corresponding write signals WC0 to WC15.

3.2. Predecoder

The control memory CM is equipped, as has been described hereinbefore, with the seven predecoders PD1 to PD7. Of these, the predecoder PD1 includes, as shown in FIG. 10, eight three-input NAND gates NA10 which are made receptive of a predetermined combination of the non-inverted and inverted signals of the complementary internal address signals a0*, a1* and a11* The output signals of those NAND gates are inverted through an N-channel MOSFET Q22 constituting a logic gate into the predecode signals X00 to X07 by a corresponding inverter N23. The gate of the MOSFET Q22 is commonly fed with the internal clock signal CP1. Between the supply voltage (i.e., the first supply voltage) of the circuit and the input terminal of the inverter N23, moreover, there is connected a P-channel MOSFET Q2 which constitutes a logic gate together with the aforementioned corresponding MOSFET Q22 receiving the aforementioned internal clock signal CP1 at its gate.

As a result, the output signal of the NAND gate NA10 is selectively set to the low level when the complementary internal address signals a0*, a1* and a11* are set in a corresponding predetermined combination to the high level. That low level is transmitted to the inverter N23 through the logic gate, which is composed of the MOSFETs Q2 and Q22, on condition that the internal clock signal CP1 is set to the high level, so that the predecode signals X00 to X07 are selectively set to the high level. When the control memory CM is rendered unselective to set the internal clock signal CP1 to the low level, the input terminal of the inverter N23 is set to the high level such as the supply voltage of the circuit so that the predecode signals X00 to X07 are forcibly set to the low level.

The predecoder PD2 is given a circuit structure similar to that of the predecoder PD1 for setting the predecode signals X10 to X17 selectively to the high level on the basis of the complementary internal address signals A1*, a12* and a13*. On the other hand, the predecoders PD3, PD4 and PD5 are constructed to have none of their logic gates composed of the aforementioned MOSFETs Q2 and Q22, and set the corresponding predecode signals X20 X27, X50 to X57, or Y80 to Y83 on the basis of the complementary internal address signals a2* to a4*, a5* to a7*, or a8* and a9*.

As has been described hereinbefore, the complementary internal address signals a0* and a1* are used to selectively designate the four sub word lines constituting each sub word line group, and the complementary internal address signals a11* to a13* are used to selectively designate the eight sub memory arrays SM0 to SM7 constituting each memory block. On the other hand, the complementary internal address signals a2* to a7* are used to selectively designate totally sixty four sets of sub word line groups constituting each sub memory array, and the complementary internal address signals a8* and a9* are used together with the complementary internal address signal A10* to selectively designate eight sets of complementary bit lines constituting each sub memory array. Incidentally, the predecode signals X00 to X07 and X10 to X17 are combined in the X-decoder with the predecode signals X20 to X27 and X50 to X57 to selectively produce the main word lines M0000–M0003 to M2S40–M2543 and the inverted main word lines M0010B–M0013B to M2550B–M2553B for designating the sub word lines and the sub memory arrays selectively. The predecode signals Y80 to Y83 are fed, as has been described hereinbefore, to the write circuits WC0 to WC15 and the read circuits RC0 to RC15 so that they are used to select the complementary bit lines. i.e., the unit write circuits UWC0 to UWC7 and the unit read circuits URC0 to URC3.

Next, the predecoder PD7 includes twelve unit predecoders UPD71 to UPD712. Each of these unit predecoders, as represented by the unit predecoder UPD71 of FIG. 11, includes the AND gate NA11 which is made receptive of the non-inverted or inverted signals of the complementary internal address signals a12* and a13*, or, in a predetermined combination, those non-inverted or inverted signals and the internal control signal WM or RM. The output signal of the NAND gate NA11 is transmitted to a corresponding inverter N″4 through a logic gate, which is composed of a pair of P-channel MOSFET Q3 and N-channel MOSFET Q23 having their gates made receptive of the internal clock signal CP1D, and inverted through two inverters N25 and N26 into the predecode signals YC0 to YC3, WC0 to WC3 and RC0 to RC3.

As a result, the predecode signals YC0 to YC3 are selectively set to the high level in accordance with the complementary internal address signals a12* and a13* independently of the internal control signals WM and RM, i.e., the operation mode of the control memory CM. On the other hand, the predecode signals WC0 to WC3 are selectively set to the high level in accordance with the complementary internal address signals a12* and a13*, when the internal control signal WM is set to the high level, namely, when the control memory CM is brought into the write mode. The predecode signal RC0 to RC8 are selectively see to the high level in accordance with the complementary internal address signals a12* and a13* when the internal control signal RM is set to the high level, namely, when the control memory CM is brought into the write mode. It is needless to say that those predecode signals YC0 to YC3, WC0 to WC3 and RC0 to RC3 are individually and selectively set to the high level on condition that the internal clock signal CP1D is set to the high level.

The predecoder PD6 is given a circuit structure substantially similar to that of the aforementioned predecoder PD7, excepting that it does not include the logic gate composed of the MOSFETs Q3 and Q23 and that the number of unit predecoders is eight. The predecoder PD6 sets the predecode signals WA0 to WA3 selectively to the high level in accordance with the complementary internal address signals a10* and a11* of 2 bits when the control memory CM is brought into the writing mode to set the internal control signal WM to the high level. Moreover, the predecoder PD6 sets the predecode signals RA0 to RA3 selectively in accordance with the complementary internal address signals a10* and a11* when the control memory CM is brought into the reading mode to set the internal control signal RM to the high level.

3.3. X-Decoder

The X-decoder XD includes, as shown in FIG. 12, totally sixty four NAND gates NA12 which are provided to correspond to the individual sub word line groups. These NAND gates are made receptive, in a predetermined combination, of the predecode signals X20 to X27 and X50 to X57. The output signals of these NAND gates are fed to one input terminal of the logic gate, which is composed of a P-channel MOSFET Q4 and an N-channel MOSFET Q24, namely, the source of the MOSFET Q24. The other input terminals of those logic gates, i.e., the gates of the MOSFETs Q4 ad Q24, are fed with a predetermined combination of the predecode signals X00 to X07 and X10 to X17. The output signal of the logic gate composed of the MOSFETs Q4 and Q24 is transmitted through three inverters N27 to N29 to the main word lines M0000–M0003 to M2540–M2543, or through two inverters N30 and N31 to the inverted main word lines M0010B–M0013B to M2550B–M2553B.

As a result, the main word lines M0000–M0003 to M2540–M2543 are selectively set to the high level in accordance with the complementary internal address signals a0* and a11*, when the output signal of the corresponding NAND gate NA12 is set to the low level and when the corresponding predecode signals X00 to X07 are set in a predetermined combination to the high level, that is, when the corresponding sub word line group is designated by the complementary internal address signals a2* to a7* and when the complementary internal address signal a1* is set to a predetermined logic level. Likewise, the main word lines M0010B–M0013B to M2550B–M2553B are selectively set to the high level in accordance with the complementary internal address signals a12* and a13*, when the output signal of the corresponding NAND gate NA12 is set to the low level and when the corresponding predecode signals X10 to X17 are set in a predetermined combination to the high level, that is, when the corresponding sub word line group is designated by the complementary internal address signals a2* to a7* and when the complementary internal address signal a1* is set to a predetermined logic level.

Thus, the sub word line drive circuit corresponding to each of the sub word lines of the sub memory arrays SM0 to SM7 is enabled to bring the corresponding sub word line into the selected state by discriminating that the corresponding main word lines M0000–M0003 to M2540–M2543 are set to the high level and that the corresponding inverted main word lines M0010B–M0013B to M2550B–M2553B. These main word lines and inverted main word lines have their logic levels changed selectively, as has been described herein-before, when the corresponding sub word line group is designated by the complementary internal address signals a2* to a7* and when the corresponding sub word line or the adjoining sub word line is designated by the complementary internal address signal a1*. As a result, in the control memory CM of this embodiment, the four main word lines or inverted main word lines are provided to correspond to each sub word line, i.e., each row address, but the current for charging or discharging those main word lines can be drastically reduced to promote low power consumption of the control memory CM.

3.4. Memory Block

Each of the memory blocks MB0 to MB15 constituting the control memory CM is divided, as has been described hereinbefore, in the word line extending direction into the eight sub memory arrays SM0 to SM7. Each of these sub memory arrays, as represented by the sub memory array SM0 of FIG. 13, includes two hundred and fifty six sub word lines, which are arranged in parallel in the horizontal direction of the same Figure, and eight sets of complementary bit lines B0* to B7* which are arranged in parallel in the vertical direction. These sub word lines and complementary bit lines have their intersections arranged in a lattice form with 256×8, i.e., 2,048 static memory cells MC0000–MC0007 to MC2550–MC2557.

The sub memory arrays SM0 to SM7 further include two hundred and fifty six sub word line drive circuits SWD000 to SWD255 corresponding to the sub word lines SW000 to SW255. Each of these sub word line drive circuits, as represented by the sub word line drive circuits SWD000 and SWD001, includes: a logic gate composed of a P-channel MOSFET Q6 or Q7 and an N-channel MOSFET Q26 or Q27; and an inverter N32 or N33. Of these, the MOSFETs Q26 and Q27 constituting the logic gate have their sources individually coupled commonly to corresponding inverted main word lines M0010B–M0013B to M2550B–M2553B, and the MOSFETs Q6 and Q26 and the MOSFETs Q7 and Q27 have their gates individually coupled commonly to the corresponding main word lines M0000–M0003 to M2540–M2543.

As a result, the sub word lines SW000 to SW255 of each sub memory array are selectively brought into selected states of the high level, when the corresponding inverted main word lines M0010B–M0013B to M2550B–M2553B are selectively set to the low level, whereas the corresponding main word lines M0000–M0003 to M2540–M2543 are selectively see to the high level, that is, when the complementary internal address signals a0* to a7* are combined to designate the corresponding row addresses, whereas the complementary internal address signals a11* to a13* are combined to designate the corresponding sub memory arrays.

In short, in the control memory CM of this embodiment, both the sub word line selecting signals for designating the sub word lines SW000 to SW255 and the array selecting signals for designating the sub memory arrays SM0 to SM7 are transmitted via the main word lines M0000–M0003 to M2540–M2543 and the inverted main word lines M0010B–M0013B to M2550B–M2553B, both of which are arranged in parallel with the sub word lines. The sub word line drive circuits SWD000 to SWD255 corresponding to the individual sub word lines are given an additional function as decoders for decoding the sub word line selecting signals and the array selecting signals partially. Moreover, the main word lines M0000–M0003 to M2540–M2543 and the inverted main word lines M0010B–M0013B to M2550B–M2553B are selectively formed, as has been described hereinbefore, when the sub word lines contained in the corresponding sub word line groups are designated. As a result, the charge or discharge currents of the individual main word lines and inverted main word lines are reduced, and the loads on the individual main word lines and inverted main word lines are lightened to promote the low power consumption and the high speed of the control memory CM.

Incidentally, in this embodiment, the number of combinations for selecting the four main word lines M0000–M0003 to M2540–M2543 and the four inverted main word lines M0010B–M0013B to M2550B–M2553B bit by bit is a total of sixteen, as is well known in the art. Since, however, these combinations are shared between the adjoining two sub word lines, the number of sub memory arrays to be provided, i.e., the array division number, is eight at the maximum.

Incidentally, in the control memory CM of this embodiment, the sub word line drive circuits SWD000 to SWD255 are constructed to include: the inverters N32 and N33 having their output terminals coupled to the corresponding sub word lines SW000 to SW255; and a logic circuit composed of the MOSFET Q6 or Q7 and Q26 or Q27. These sub word line drive circuits are not different from a two-input NOR gate, for example, as viewed merely from the number of circuit elements. In case, however, the drivability of the sub word line drive circuits is to be raised so as to speed up the selecting operations of the word lines thereby to speed up the control memory CM, the MOSFETs Q6 and Q7, and Q26 and Q27 constituting the logic gate can be formed with a small size. Thus, as compared with the case in which a two-input NOR gate having two P-channel MOSFETs and N-channel MOSFETs connected in series between the output terminals and the supply voltage or ground potential of the circuit is used, there can be attained an effect to reduce the desired layout area for the sub word line drive circuits drastically so that the desired layout area of the control memory CM can be reduced.

3.5. Equalize Circuit

The control memory CM is equipped, as has been described hereinbefore, the sixteen equalize circuits EQ0 to EQ15 corresponding to the memory blocks MB0 to MB15. Each of these equalize circuits is in turn, equipped with the eight unit equalize circuits UEQ0 to UEQ7 corresponding to the sub memory arrays SM0 to SM7 of each memory block. Each of these unit equalize circuits, as represented by the unit equalize circuit UEQ0, includes eight sets of, i.e., totally twenty four P-channel MOSFETs Q8 to Q10 which are connected in series and parallel between the non-inverted and inverted signal lines of the complementary bit lines B0* to B7* of the corresponding sub memory arrays SM0 to SM7. Of these, the MOSFETs Q8 and Q9 have their sources individually coupled to the supply voltage of the circuit. On the other hand, all the gates of the MOSFETs Q8 to Q10 are commonly coupled to one another and further to the output terminal of an inverter N35. This inverter N35 has its input terminal coupled to the output terminal of an inverter N34, which has its input terminal fed individually with the corresponding predecode signals YC0 to YC3. Incidentally, these predecode signals YC0 to YC3 are individually fed commonly to the two adjoining unit equalize circuits UEQ0 and UEQ1 to UEQ6 and UEQ7.

Thus, the MOSFETs Q8 to Q10 constituting the two adjoining unit equalize circuits are turned on selectively and altogether when the corresponding predecode signals YC0 to YC3 are selectively set to the high level. As a result, the non-inverted and inverted signal lines of the totally sixteen sets of complementary bit lines B0* to B7* constituting the adjacent two sub memory arrays SM0 and SM1 to SM6 and SM7 are equalized to the precharge level such as the supply voltage of the circuit.

3.6. Write Circuit

The control memory CM is equipped, as has been described hereinbefore, with the sixteen write circuits WC0 to WC15 corresponding to the memory blocks MB0 to MB15. Each of these write circuit is equipped with the eight unit write circuits UWC0 to UWC7 corresponding to the sub memory arrays SM0 to SM7 of each memory block. Each of these unit write circuits, as represented by the unit write circuit UWC0 of FIG. 14, includes totally sixteen sets of N-channel MOSFETs Q28 (i.e., a first MOSFET) and Q29 (i.e., a second MOSFET) and Q30 (i.e., a first MOSFET) and Q31 (i.e., a second MOSFET), which are connected in series between the non-inverted and inverted signal lines of the complementary bit lines B0* to B7* of the corresponding sub memory array and the ground potential (i.e., a second supply voltage) of the circuit. Of these, the MOSFET Q28 has its gate fed commonly with the inverted signal of the output signal of a NAND gate NA14 by an inverter N37, and the MOSFET Q30 has its gate fed commonly with the inverted signal of the output signal of a NAND gate by an inverter N38. On the other hand, the MOSFETs Q29 and Q31 have their gates fed individually with the inverted signal of the output signal of a NAND gate NA13 by an inverter N36.

Here, the NAND gate NA14 has its one input terminal fed individually with the corresponding predecode signals WC0 to WC3 and its other input terminal fed individually with the corresponding inverted write signals WD0B to WD15B. Likewise, the NAND gate NA15 has its one input terminal Fed individually with the corresponding predecode signals WC0 to WC3 and its other input terminal fed individually with the corresponding non-inverted write signals WD0 to WD15. Incidentally, the predecode signals WC0 to WC3 are fed individually and commonly to adjoining two unit write circuits UWC0 and UWC1 to UWC6 and UWC7. Moreover, the inverted write signals WD0B to WD15B and the non-inverted write signals WD0 to WD15 are fed individually and commonly to the corresponding eight unit write circuits UWC0 to UWC7. As a result, the output signal of the NAND gate NA14 is selectively set to the low level, when the corresponding predecode signals WC0 to WC3 are selectively set to the high level and when the corresponding inverted write signals WD0B to WD15B are set to the high level, so that the corresponding MOSFET Q28 is selectively turned on. Likewise, the output signal of the NAND gate NA15 is selectively set to the low level, when the corresponding predecode signals WC0 to WC3 are selectively set to the high level and when the corresponding write signals WD0 to WD15 are set to the high level, so that the corresponding MOSFET Q30 is selectively turned on.

Next, the NAND gate NA13 has its one input terminal fed individually with the corresponding predecode signals Y80 to Y83 and its other input terminal fed sequentially and commonly with every four corresponding predecode signals WA0 to WA3. On the other hand, the output signal of the NAND gate NA13 is selectively set to the low level, when the predecode signals Y80 to Y83 and WA0 to WA3 are set selectively in a corresponding combination to the high level, so that the corresponding MOSFETs Q29 and Q31 are selectively turned on. As has been described hereinbefore, the non-inverted and inverted signal lines of the complementary bit lines B0* to B7* constituting each sub memory array are equalized to the high level such as the supply voltage of the circuit and are precharged. By turning on the MOSFET Q28 or Q30 selectively in accordance with the logic levels of the corresponding complementary write signals WD0* to WD16* and by turning on the MOSFETs Q29 and Q31 selectively when the corresponding complementary bit lines of the corresponding sub memory array are designated, as described above, the non-inverted or inverted signal lines of the complementary bit lines B0* to B7* are selectively set to the low level so that the writing operation according to the complementary write signals WD0* to WD15* can be realized. This writing method is accomplished merely by extracting the precharge level of the non-inverted or inverted signal lines of the complementary bit lines and is not accompanied by the inversion of the latch circuit unlike the prior art, so that the writing operation of the control memory CM can be speeded up while its power consumption being reduced.

3.7. Read Circuit

The control memory CM is equipped, as has been described hereinbefore, with the sixteen read circuits RC0 to RC15 corresponding to the memory blocks MB0 to MB15, and these read circuits are equipped with the four unit read circuits URC0 to URC3 corresponding to the adjoining two sub memory arrays SM0 and SM1 to SM6 and SM7. Each of these unit read circuits, as represented by the unit read circuit URC0 of FIGS. 14 and 15, includes: a column switch composed of totally sixteen P-channel MOSFETs Q11 and Q12 corresponding to the complementary bit lines B0* to B7* of the adjoining two sub memory arrays; and a sense amplifier SA constructed basically of four differential amplifier circuits RDA1 to RDA4.

Here, the gates of the MOSFETs Q11 and Q12 constituting the column switch of each unit read circuit are commonly coupled to each other and further to the output terminal of a corresponding NAND gate NA16. This NAND gate NA16 has its one input terminal fed individually with the corresponding predecode signals Y80 to Y83 and its other input terminal fed individually with the corresponding predecode signals RA0 to RA3. Thus, the output signal of the NAND gate NA16 is selectively set to the low level, when both the predecode signals Y80 to Y83 and RA0 to RA3 are set in a corresponding combination to the high level, so that the corresponding MOSFETs Q11 and Q12 are selectively turned on. As a result, a designated set of the complementary bit lines B0* to B7* of the adjoining two sub memory arrays is selectively connected with the corresponding complementary common data line CD0* or CD1*.

Next, the sense amplifier SA of each unit read circuit includes: the differential amplifier circuit RAD1 having its complementary input terminals coupled to the non-inverted and inverted signal lines of the corresponding complementary common data line CD0* or CD1*; and P-channel type equalize MOSFETs Q13 to Q15 connected between the non-inverted and inverted signal lines of the complementary common data lines CD0* and CD1*. Further inclusive are: a pair of differential amplifier circuits RDA2 and RDA3 which have their complementary input terminals made receptive of the non-inverted and inverted output signals of the differential amplifier circuit RDA1; and another differential amplifier circuit RDA4 having its non-inverted input terminal made receptive of the non-inverted output signal of the differential amplifier circuit RDA2 and its inverted input terminal made receptive of the inverted output signal of the differential amplifier circuit RDA3. The drive MOSFETs of those differential amplifier circuits and the aforementioned equalize MOSFETs are fed individually with the corresponding predecode signals RD0 to RC3 through inverters N39 and N40.

Thus, the sense amplifier SA of the unit read circuit is selectively rendered operative, when the corresponding predecode signals RC0 to RC8 are selectively set to the high level, to amplify the read signals outputted from the memory cell of the designated one of the corresponding two sub memory arrays via a corresponding complementary data line CD0* or CD1* thereby to produce an inverted read signal R00B or R01B. When the corresponding predecode signals RC0 to RC3 are set to the low level, all the four differential amplifier circuits RDA1 to RDA4 constituting the sense amplifier SA are rendered inoperative so that the non-inverted and inverted signal lines of the complementary common data lines CD0* and CD1* are equalized by the MOSFETs Q13 to Q15.

The inverted read signals R00B and R01B, and R02B and R03B, which are outputted from the adjoining two unit read circuits URC0 and URC1, and URC2 and URC3, are individually fed to the one and other input terminals of a corresponding NAND gate NA17 so that their NOR is taken. The output signal of the NAND gate NA17 is inverted by an inverter N41 and is then fed as the output signals of the individual read circuits, i.e., the inverted read signals R001B and R023B to the corresponding data output circuits OC0 to OC15.

3.8. Data Output Circuit

The control memory CM is equipped, as has been described hereinbefore, with the sixteen data output circuits OC0 to OC15 corresponding to the memory blocks MB0 to MB15. Each of these data output circuits, as represented by the data output circuit OC0 of FIG. 16, includes: a NAND gate NA18 (i.e., a first NAND gate) having its first input terminal made receptive of the internal control signal (i.e., the output control signal) RM; and a NAND gate NA19 (i.e., a second NAND gate) having its first input terminal coupled to the output terminal of the aforementioned NAND gate NA18. The second input terminal of the NAND gate NA18 is coupled to the output terminal of the NAND gate NA19. Thus, the NAND gates NA18 and NA19 constitute together a latch circuit. The second and third input terminals of the NAND gate NA19 are individually fed with the inverted read signals R001B and R023B from the two unit read circuits URC0 and URC2 of the corresponding read circuits RC0 to RC15. The output signal of the NAND gate NA19 is inverted by an inverter N42 and is outputted as the read data RD0 to RD15 from the corresponding data output terminals D00 to D015.

When the internal control signal RM is set to the low level, the NAND gate NA18 of each data output circuit is rendered non-transmissive so that the inverted read signal R001B or R023B outputted from the unit read circuits URC0 and URC2 is transmitted as it is to the output terminal of the NAND gate NA19, i.e., the data output terminals D00 to D015. If the control memory CM is brought into a selected state to set the internal control signal RM to the high level, the NAND gates NA18 and NA19 are given the latch mode to hold the logic level of the inverted read signal R001B or R023B immediately before. As a result, the substantially effective read data RD0 to RD15 are outputted to the data output terminals D00 to D015. In other words, the data output circuits OC0 to OC15 of this embodiment is constructed by integrating the NAND gate NA18 having a substantial gate control function by the internal control signal RM and the NAND gate NA19 having a substantial OR function for the inverted read signals R001B and R023B, so that the data output circuits OC0 to OC15 can be simplified with high-speed operations.

4. Modification of Sub Memory Array

Figure 17:
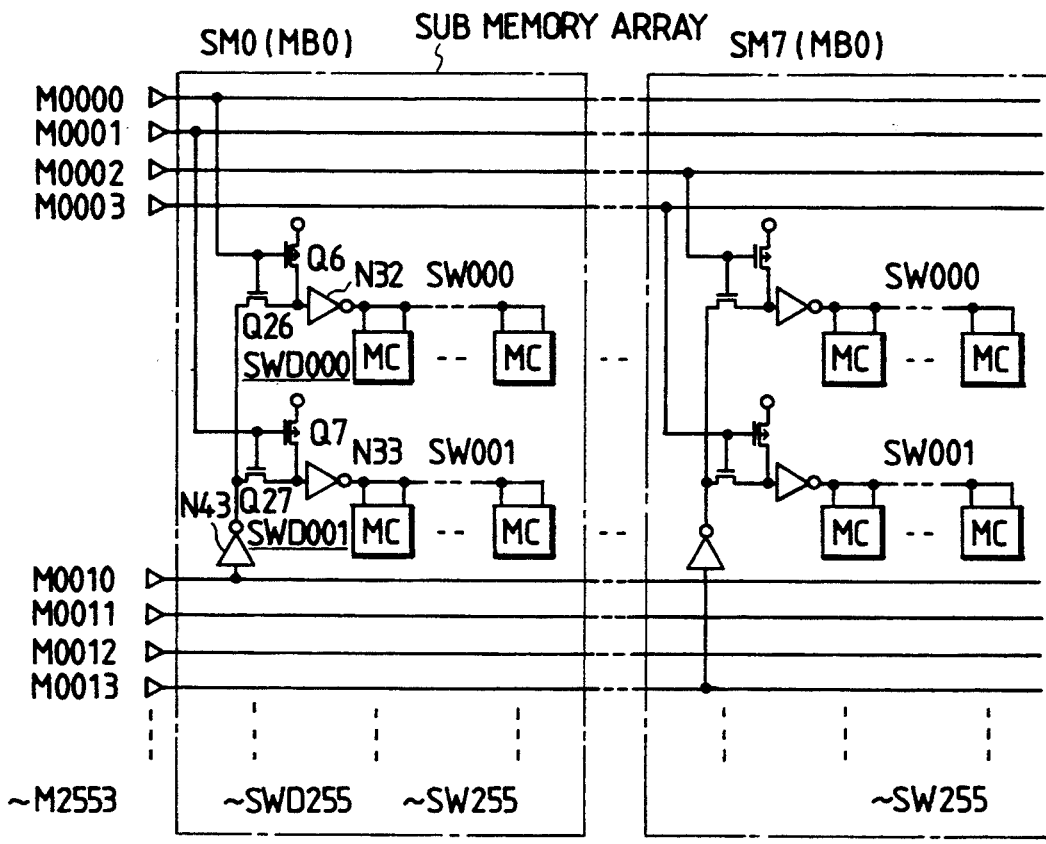
FIG. 17 is a selecting conception diagram showing a second embodiment of the control memory according to the present invention.
Figure 18:
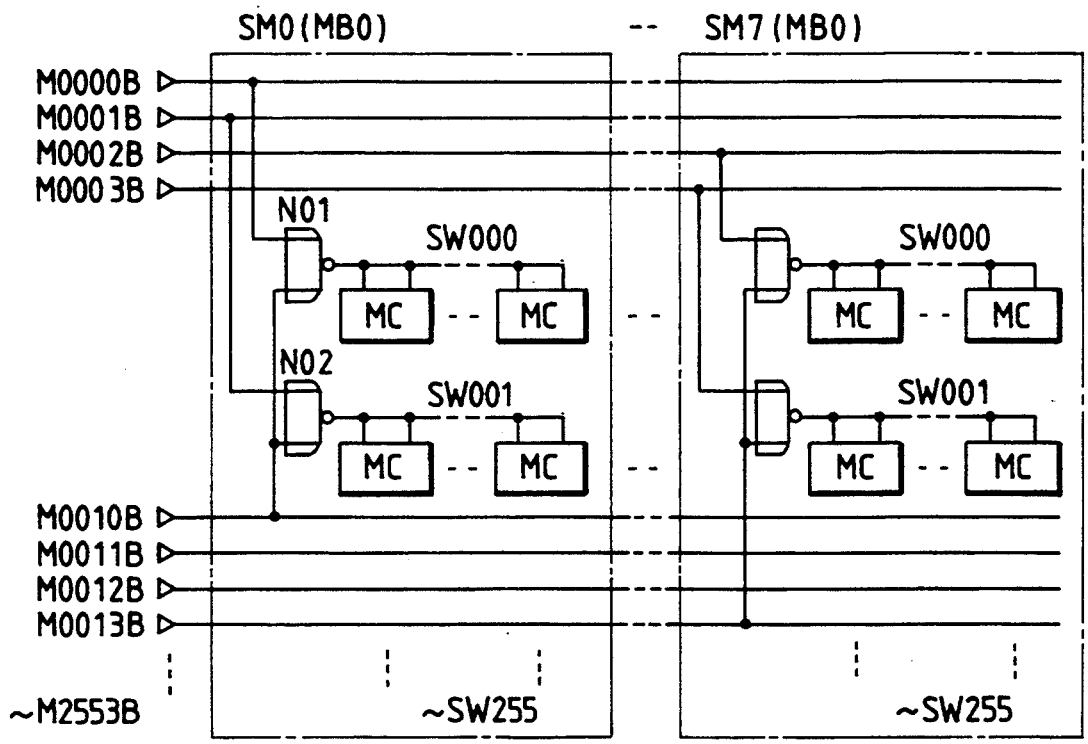
FIG. 18 is a selecting conception diagram showing a third embodiment of the control memory according to the present invention.
Figure 19:
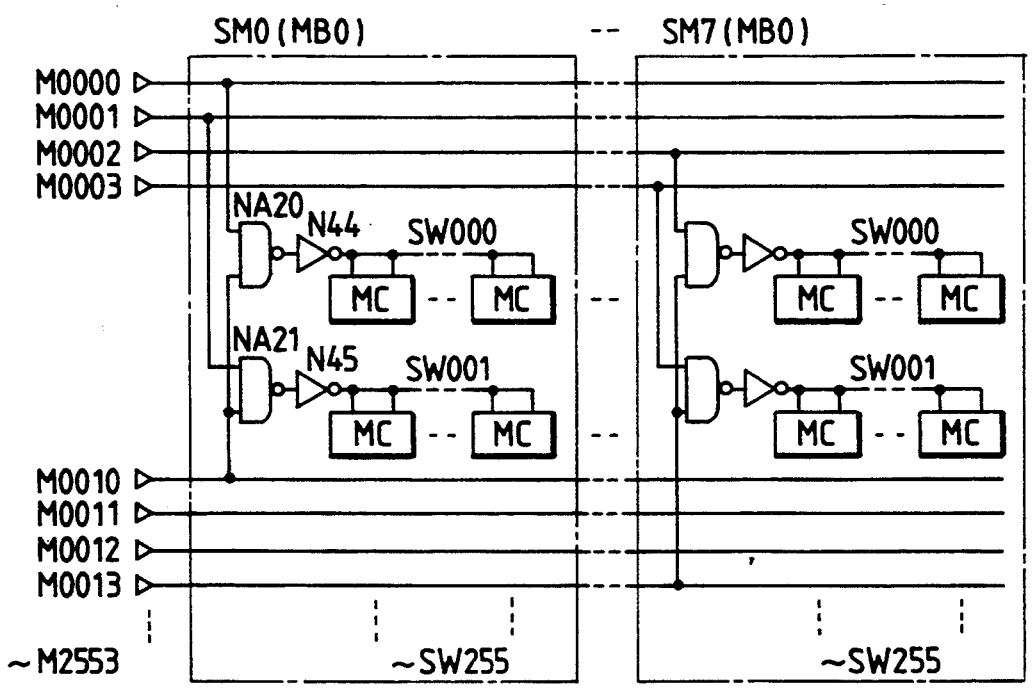
FIG. 19 is a selecting conception diagram showing a fourth embodiment of the control memory according to the present invention.

FIGS. 17 to 28 are selecting conception diagrams showing second to eighth embodiments of the sub memory arrays contained in the memory blocks MB0 to MB15 of the control memory CM according to the present invention. With reference to these Figures, several modifications of the sub memory cell array according to the present invention will be described together with the features thereof. Incidentally, the modifications of FIGS. 17 to 19 are made by replacing only the sub word line drive circuits SWD000 to SWD255 of the foregoing embodiment of FIG. 12 by other sub word line drive circuits, and the remaining modifications basically follow the foregoing embodiment of FIG. 12 in the number of the sub word lines constituting each sub memory array and the structure of the memory cell MC.

4.1. Modification Having Inverters Added to Sub Word Drive Circuits of FIG. 12

As shown in FIG. 17, the sub memory arrays SM0 to SM7 of this embodiment include totally one hundred and twenty eight inverters N43 which are provided to correspond to the adjoining two sub word line drive circuits SWD000 and SWD001 to SWD254 and SW255. These inverters have their input terminals coupled individually to the corresponding main word lines M0010–M0013 to M2550–M2553 and their output terminals coupled individually and commonly to the sources of the N-channel MOSFETs Q26 and Q27 constituting the logic gate of the corresponding two sub word line drive circuits. The gates of the MOSFET Q26 constituting the logic gate and the P-channel MOSFET Q6 are individually coupled to the corresponding main word lines M0000–M0003 to M2540–M2543.

Thus, the sub word lines SW000 to SW255 of each sub memory array are selectively brought into the selective state of the high level when both the corresponding main word lines M0000–M0003 to M2540–M2543, and M0010–M0013 to M2550–M2553 are set in a corresponding combination to the high level. In other words, in the sub memory arrays SM0 to SM7 of this embodiment, both the two sets of corresponding main word lines can be formed as the non-inverted signals by adding the inverter N43 to the source sides of the N-channel MOSFETs Q26 and Q27 constituting the logic gate. This is effective, especially in case three or more sets of main word lines are combined, to release the restriction on the combining condition thereby to increase the number of divisions of the sub memory array.

4.2. Modification Having Sub Word Drive Circuits of FIG. 12 Replaced by NOR Gates As shown in FIG. 18, the sub word line drive circuits SWD000 to SWD255 of FIG. 12, which are provided to correspond to each sub word line of the sub memory arrays SM0 to SM7, are replaced by two-input NOR gates NO1 and NO2. Thus, both two sets of main word lines corresponding to the two sub word lines are used as the inverted signal lines. As a result, this embodiment has an effect to release the restriction on the combining condition of the main word lines like the foregoing embodiment of FIG. 17. Here, the NOR gates NO1 and NO2 include, as has been described herein-before, the two P-channel MOSFETs and N-channel MOSFETs which are individually connected in series between the output terminals thereof and the supply voltage and ground potential of the circuit. Thus, in order to enhance the drivability of the sub word line drive circuits thereby to speed up the control memory CM, those MOSFETs have to be large-sized thereby to increase the layout area required for the control memory CM.

4.3. Modification Having Sub Word Line Drive Circuits of FIG. 12 Replaced by AND Gate and Inverter As shown in FIG. 19, the sub word line drive circuits SWD000 to SWD255 of FIG. 12, which are provided to correspond to the individual sub word lines of the sub memory arrays SM0 to SM7, are replaced by either a NAND gate NA20 and an inverter N44 or a NAND gate NA21 and an inverter N45. Thus, both the two sets of main word lines provided to correspond to the two sub word lines are non-inverted signal lines. Thus, this embodiment has an effect to release the restriction on the combining condition of the main word lines like the foregoing embodiment of FIG. 17. Since the sub word line drive circuits of this embodiment can have their drivability increased by enlarging the sizes of the MOSFETs constituting the inverters N44 and N45, the MOSFETs constituting the NAND gates NA20 and NA21 can be formed with a relatively small size. As a result, this embodiment can also have an effect to reduce the desired layout area of the control memory CM although it cannot match the embodiment of FIG. 17.

4.4. Modification for Selecting Sub Word Lines with One Set of Main Word Lines

Figure 20:
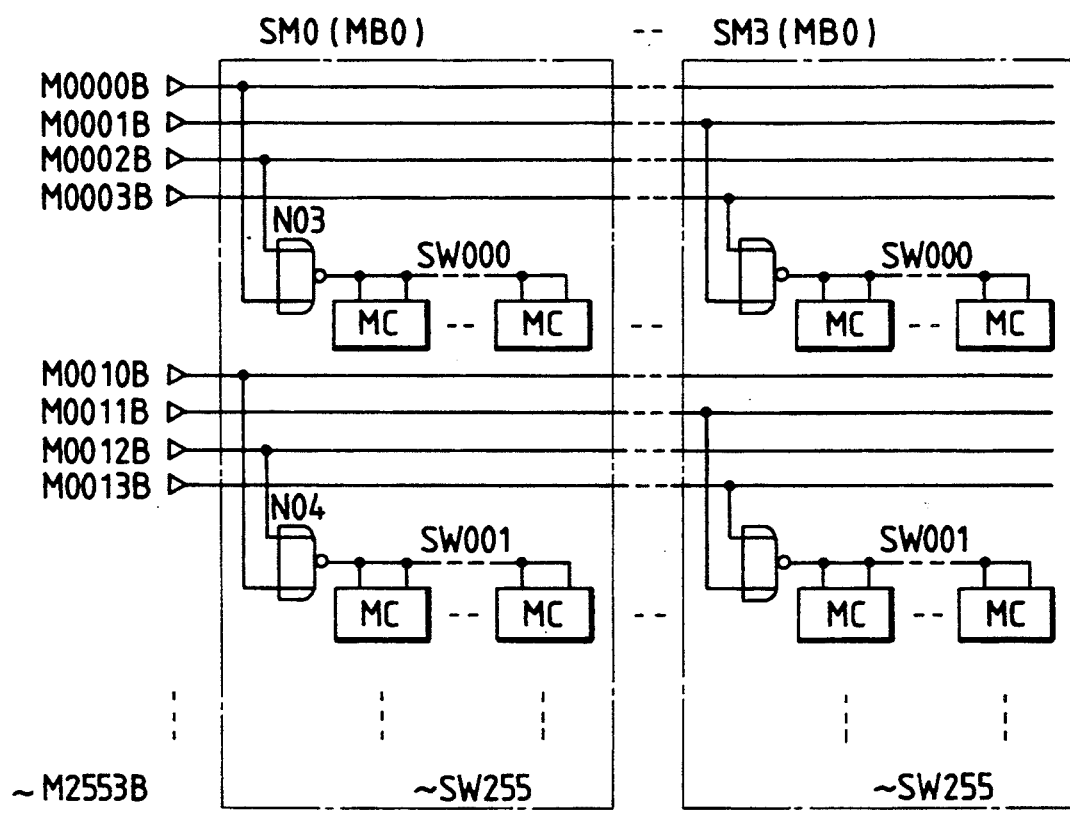
FIG. 20 is a selecting conception diagram showing a fifth embodiment of the control memory according to the present invention.

As shown in FIG. 20, the sub word line drive circuits provided to correspond to the sub word lines SW000 to SW255 of each sub memory array are constructed to include two-input NOR gates NO3 and NO4. These NOR gates have their one input terminal coupled to either of the more significant 2 bits of one corresponding set of inverted main word lines M0000B–M0001B to M2550B–M2553B and their other input terminal coupled to either of the less significant 2 bits. It is needless to say that the more and less significant 2 bits of those inverted main word lines are selectively set under independent conditions to the low level. Moreover, the number of combinations for selecting one set, i.e., four inverted main word lines by 2 bits, and the number of sub memory arrays, i.e., the number of dividing the arrays is up to 4. This modification has an effect to simplify the structure of the sub memory arrays thereby to enlarge the division number to 16, for example, in case the number of main word lines to be laid out for each memory cell is 8 or more, for example.

Figure 21:
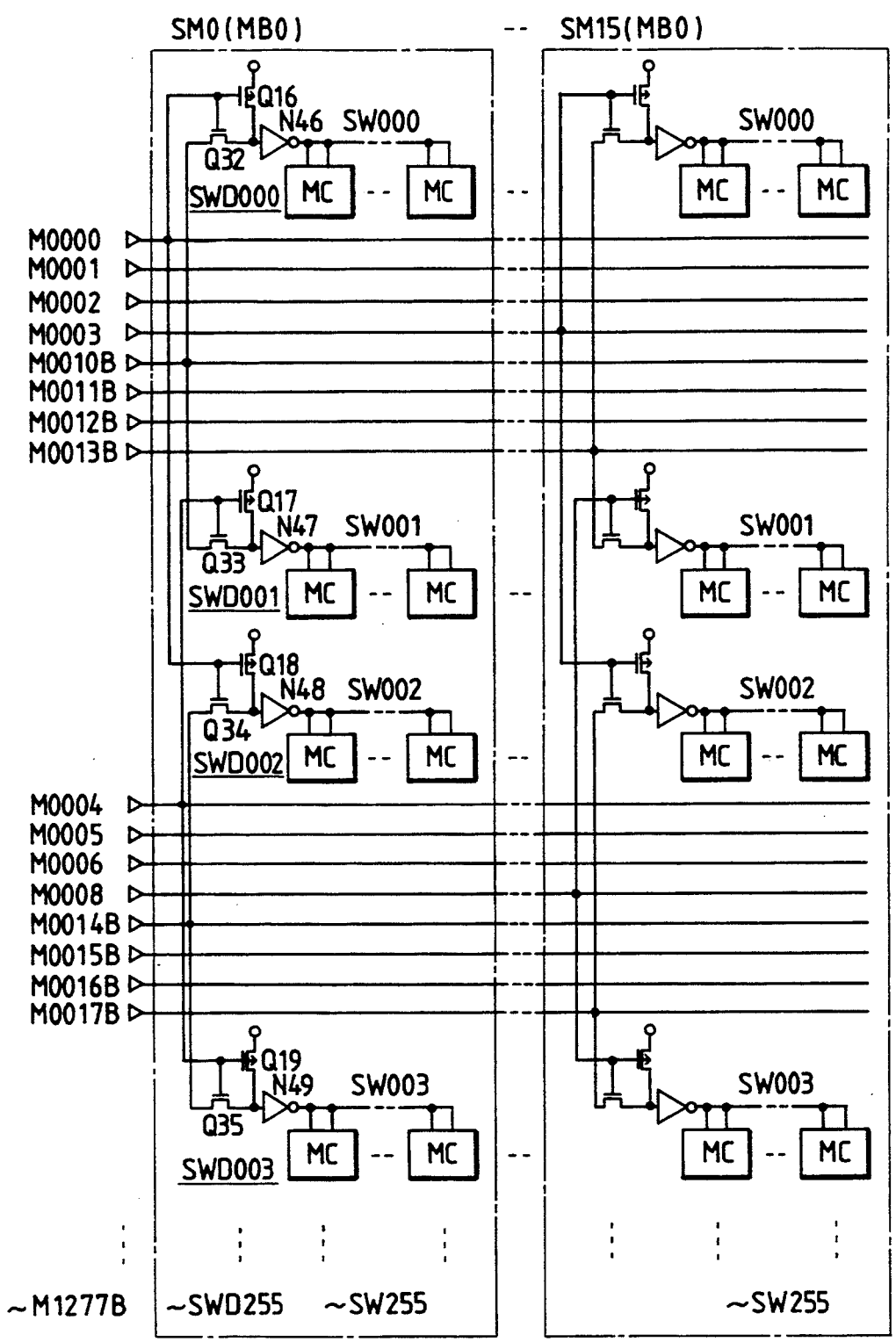
FIG. 21 is a selecting conception diagram showing a sixth embodiment of the control memory according to the present invention.

4.5. Modification for Selecting Sub Word Lines with Two Sets of Main Word Lines Each of 8 Bits As shown in FIG. 21, the sub word lines SW000 to SW255 constituting each sub memory array are divided into sixty four sub word line groups each composed of four lines, and the main word lines M0000–M0007 to M1260–M1267 of 8 bits and the inverted main word lines M0010B–M0017B to M1270B–M1277B of 8 bits are provided to correspond to those sub word line groups. These main word lines and inverted main word lines are divided into groups each composed of four lines and are arranged over the corresponding four memory cells.

Each of the sub word line drive circuits SWD000 to SWD255 corresponding to each sub word lines, as represented by the sub word line drive circuits SWD000 to SWD003 of FIG. 21, includes: a logic gate composed of one of P-channel MOSFETs Q16 to Q19 and one of N-channel MOSFETs Q32 to Q35; and one of inverters N46 to N49. Of these, the MOSFETs Q32 to Q35 constituting the logic gates have their sources coupled individually to the corresponding inverted main word lines M0010B–M0017B to M1270B–M1277B, and the MOSFETs Q32 to Q35 and Q16 to Q19 have their gates coupled individually to the corresponding main word lines M0000– M0007 to M1260–M1267. Thus, the two hundred and fifty six sub word lines SW000 to SW255 constituting each sub memory array are selected into selected states of the high level on condition that the main word lines M0000–M0007 to M1260–M1267 are selectively set to the high level and that the corresponding inverted main word lines M0010B–M0017B to M1270B–M1277B are selectively set to the low level.

As is well known in the art, the number of combinations for selecting the two sets of main word lines and inverted main word lines of 8 bits individually by 1 bit is totally sixty four. These combinations are shared by the four sub word lines composing a sub word line group. Thus, the number of sub memory arrays to be provided, i.e., the number of dividing the arrays is one quarter of sixty four, i.e., sixteen. This modification is characterized in that the number of dividing the arrays is enlarged despite of the fact that the structure of the sub memory arrays including the sub word line drive circuit is hardly different from that of the foregoing embodiment of FIG. 12, so that the reduction of the power consumption of the control memory CM can be further promoted.

Figure 22:
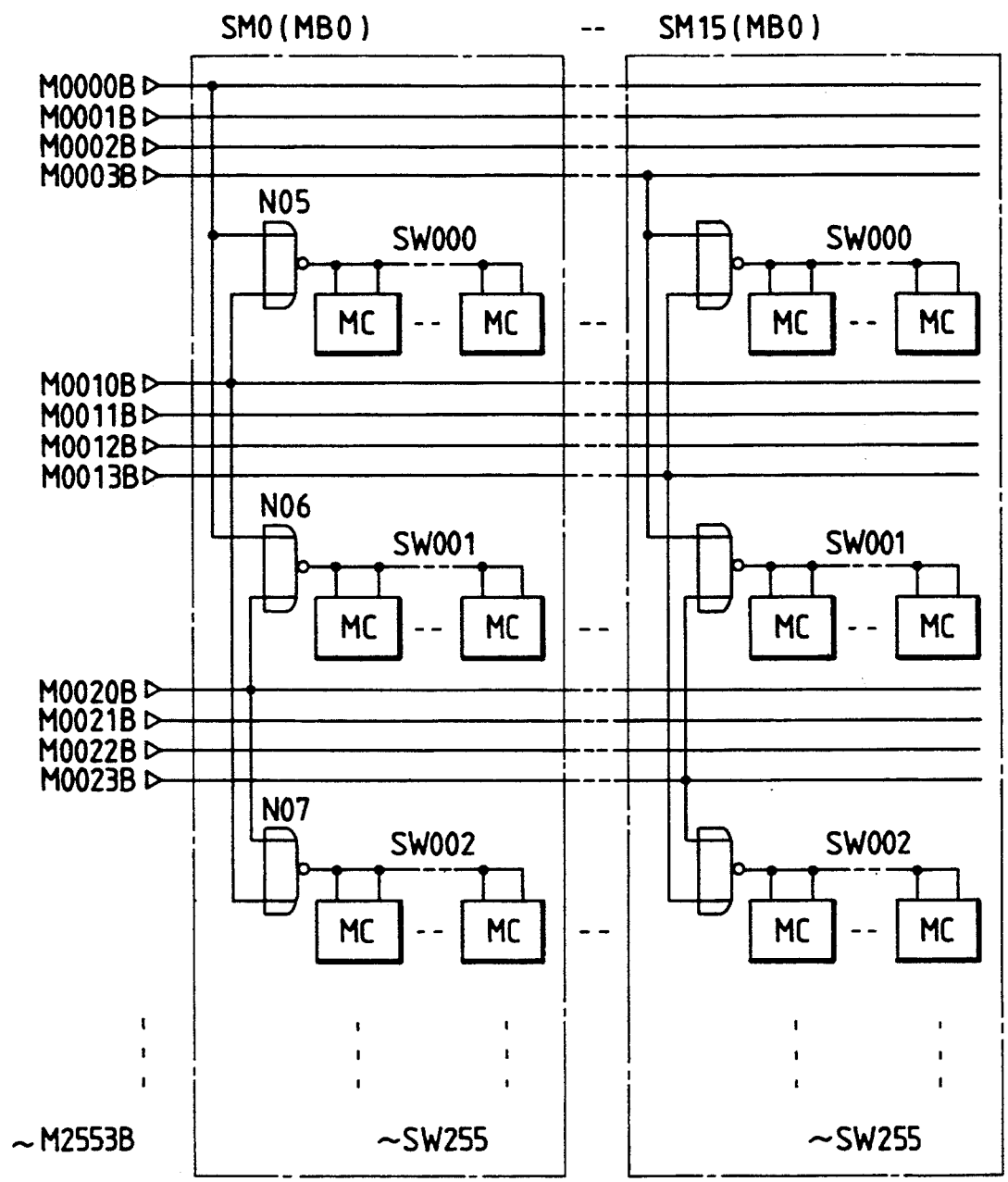
FIG. 22 is a selecting conception diagram showing a seventh embodiment of the control memory according to the present invention.

4.6. Modification for Selecting Sub Word Lines with Three Sets of Main Word Lines Each Composed of 4 Bits As shown in FIG. 22, the sub word lines SW000 to SW255 composing each sub memory array are divided into sub word line groups each composed of three lines, and three sets of inverted main word lines M0000B–M0003B to M2550B–M2553B each having 4 bits are prepared to correspond to those sub word line groups. These inverted main word lines are divided into groups each having four lines and are arranged over the corresponding three memory cells.

The sub memory arrays further include NOR gates NO5 to NO7 which are provided to correspond to the individual sub word lines and to function as the sub word line drive circuits. These NOR gates have their one input terminals coupled to any bit of one set of inverted main word lines and its other input terminals coupled to any bit of another set of the inverted main word lines. Thus, the sub word lines SW000 to SW255 constituting each sub memory array are selectively brought into selected states of the high level when both the 2 bits of the corresponding three sets of inverted main word lines.

As is well known in the art, the number of combinations for selecting one bit from each of the two of the three sets of inverted main word lines each composed of 4 bits is totally 48. These combinations are shared among the three sub word lines constituting the sub word line groups. Thus, the number of sub memory arrays to be provided in each memory block, i.e., the number of dividing the arrays is one third of 48, i.e., 16. This modification is characterized in that the same array dividing number as that of FIG. 21 can be realized by combining the adjoining three sets of main word lines, so that the control memory CM can have its layout simplified while promoting its low power consumption.

Figure 23:
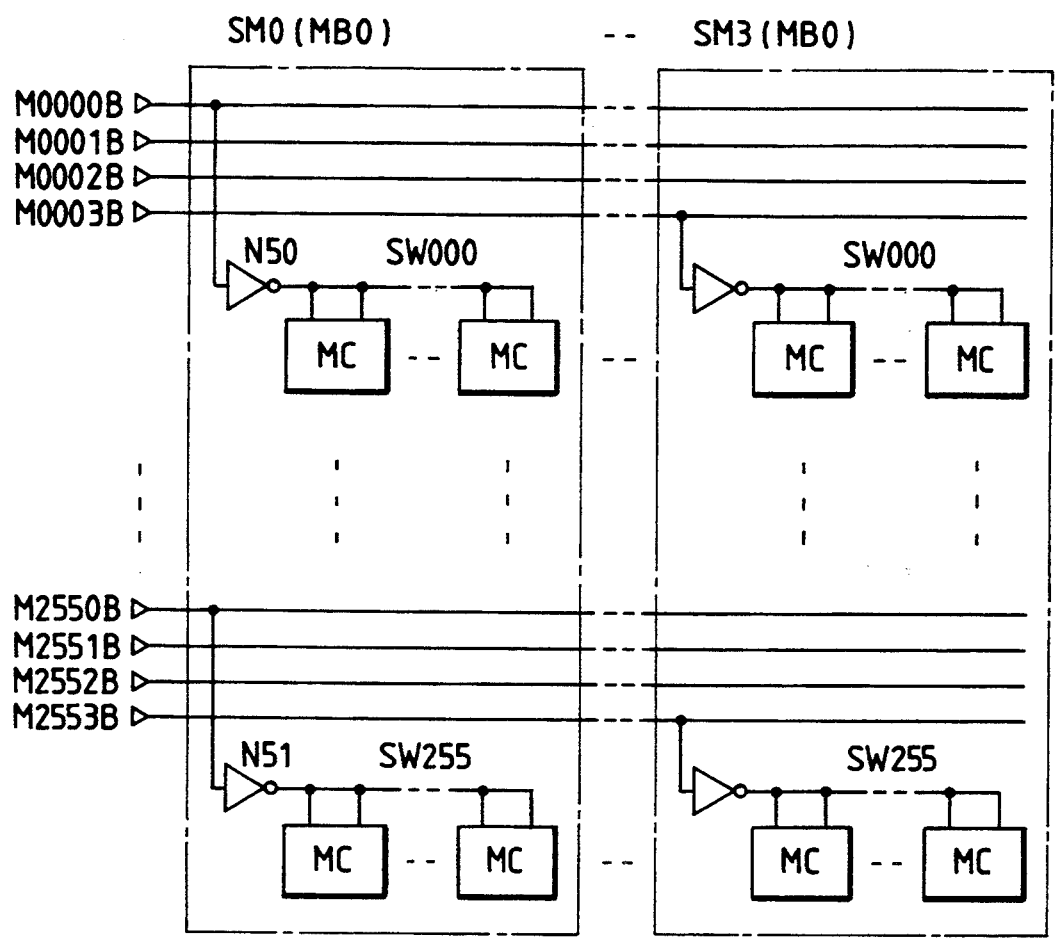
FIG. 23 is a selecting conception diagram showing an eighth embodiment of the control memory according to the present invention.

4.7. Modification for Selecting Sub Word Lines without Combining Main Word Lines As shown in FIG. 23, each sub memory array includes inverters N50 and N51 which are provided to correspond to the sub word lines SW000 to SW256 and to function as the sub word line drive circuits. These inverters have their output terminals coupled individually to the corresponding sub word lines SW000 to SW255 and their input terminals coupled to any of the corresponding one set inverted main word lines M0000B–M0003B to M2550B–M2553B. Thus, the sub word lines SW000 to SW255 of each sub memory array are selectively brought into selected states of the high level when the corresponding inverted main word lines M0000B– M0003B to M2550B–M2553B.

This modification is characterized in that the array dividing number is determined in dependence upon how many main word lines could be laid out for one memory cell, and is advantageous in that the algorithm for selecting the sub word lines is simple and in that the structure of the sub memory arrays containing the sub word line drive circuits is simplified.

As has been described in connection with the foregoing embodiments, the following effects can be attained by applying the present invention to a semi-conductor storage device such as a static RAM to be packaged in a digital switch integrated circuit of a time sharing digital converter:

(1) A memory array such as a static RAM to be packaged in a digital switch integrated circuit is divided in the extending direction of word lines to form a plurality of sub memory arrays. Array selecting signals for selecting those sub memory arrays and sub word line selecting signals for selecting sub word lines are combined to produce word line selecting signals selectively. Word line selecting signal lines for transmitting those word line selecting signals are arranged as main word lines in parallel with the sub word lines. Thus, sub word line drive circuits are provided for bringing the corresponding sub word lines selectively into selected states by combining at least 2 bits of the word line selecting signals in a manner to correspond to the individual sub word lines. The sub word line drive circuits can be given a decoder function to extend array selecting conditions, thereby increasing the array dividing number. Thus, there can be attained an effect that the number of memory cells to be activated in a single memory access can be decreased to reduce the power consumption of the static RAM or the like.

(2) Thanks to the aforementioned structure (1), the sub word lines and the main word lines can be coupled indirectly through the sub word line drive circuits to lighten the loads upon the main word lines. Thus, there can be attained an effect that the static RAM or the like can have its power consumption reduced without having its high-speed operation sacrificed.

(3) Thanks to the aforementioned structure (1), only the word line selecting signals corresponding to the designated sub word lines can be selectively produced by combining the sub word line selecting signals and the array selecting signals to reduce the charge and discharge currents of the main word lines, i.e., the array selecting signal lines. Thus, there can be attained an effect that the reduction of the power consumption of the static RAM or the like can be further promoted.

(4) In the aforementioned structures (1) to (3), the number of the main word lines provided to correspond to the individual sub word lines is restricted to that of the main word lines to be laid out to correspond to one memory cell. Thus, there can be attained an effect that an increase in the layout area required for the static RAM or the like can be prevented.

(5) In the aforementioned structures (1) to (4), one of the adjoining main word lines is provided for a non-inverted signal whereas the other main word line is provided for an inverted signal. The sub word line drive circuit is constructed to include: an inverter having its output terminal coupled to a corresponding sub word line: an N-channel MOSFET connected between a predetermined bit of the main word line for the inverted signal and an input terminal of the inverter and having its gate coupled to a predetermined bit of the main word line for the non-inverted signal; and P-channel MOSFET connected between the supply voltage of the circuit and the input terminal of the inverter and having its gate coupled to a predetermined bit of the main word line for the non-inverted signal. As a result, the drivability of the sub word line drive circuit can be increased merely by enlarging the size of a MOSFET constituting the inverter. Thus, there can be attained an effect that the layout area required for the static RAM or the like can be further reduced.

(6) In the aforementioned structure (5), the sub word drive circuit provided to correspond to the same row address of the adjoining sub memory arrays is laid out at the side of the boundary between the sub memory arrays so that the layout area of the sub word line drive circuit can be shared between the adjoining sub memory arrays. Thus, there can be attained an effect that the layout area required for the static RAM or the like can be further reduced.

(7) Thanks to the aforementioned structures (1) to (6), there can be attained an effect that the multi-bit structure of the static RAM or the like can be promoted.

(8) Thanks to the aforementioned structures (1) to (7), there can be attained an effect that the reduction of the power consumption and the increase in the capacity of the digital switch integrated circuit including the static RAM or the like and accordingly the time sharing digital converter can be promoted.

(9) In the aforementioned structures (1) to (8), in case the non-inverted and inverted signal lines of complementary bit lines constituting the sub memory arrays when unselected are precharged to a high level such as the supply voltage of the circuit, there is connected switch means to be selectively turned on in accordance with write data between the non-inverted and inverted signal lines of the complementary bit lines and the ground potential of the circuit. Thus, there can be attained an effect that the writing operation of the static RAM or the like can be speed up while reducing the layout area required for a write circuit.

(10) In the aforementioned structures (1) to (9), the data output circuit is constructed to include: a first NAND gate having its first input terminal made receptive of a predetermined output control signal; and a second NAND gate having its first input terminal coupled to the output terminal of the first NAND gate and its output terminal coupled to the second input terminal of the first NAND gate and having its other input terminal made receptive of the inverted output signals of at least two read circuits. As a result, the data output circuit can be given a gate control function by the output control signal and an OR function. Thus, there can be attained an effect that the data output circuit can have its structure simplified while having its operation speeded up.

Our invention has been specifically described hereinbefore in connection with various embodiments thereof. However, the invention should not be restricted to the foregoing embodiments, but could naturally be modified in various ways without departing the gist thereof. In FIGS. 1 and 2, for example, both the number of the input and output highways to be coupled to the digital switch integrated circuit and the number of the time slots of the highways can be set at will. Moreover, the address structure and bit structure of the speech pass memory SPM and the control memory CM are arbitrary, and the block structure and layout of the digital switch integrated circuit are not restricted by the embodiments. In FIGS. 3 and 4, the selecting condition of the control memory CM and the combination of the address signals in the predecoders could be exemplified in various manners. Moreover, the block structures of the control memory CM and the individual memory blocks are not restricted by the embodiments, and the names of the start control signals such as the block signals CLK and the read/write signals R/W are not restricted. The address assignment of the memory blocks shown in FIG. 5 could be set at will, and the layout of the control memory CM shown in FIG. 6 could take a variety of modes of embodiment. In FIG. 7, the main word lines and the bits could be formed of a wiring layer of a metal other than aluminum, and the sub word lines could be made of a gate material other than poly-silicon. Furthermore, the specific circuit structures of the individual portions of the control memory CM shown in FIGS. 8 to 16 are not restricted by the illustrated embodiments, but could also be varied with regard to the polarity of the supply voltage or the conductivity types of the MOSFETs. Also, the sub word line drive circuits to be used in the modifications of FIGS. 20 to 23 could be suitably replaced by the sub word line drive circuits shown in FIG. 12 and FIGS. 17 to 19.

In the description thus far made, our invention has been described mainly in case it is applied to a static RAM to be packaged in a digital switch integrated circuit of a time sharing digital converter backgrounding the application thereof and used as a control memory or the like. Despite this description, however, the invention should not be restricted thereto, but could also be applied to a unit to be formed as the static RAM or an on-chip RAM packaged in a gate array integrated circuit device or the like. The present invention can be widely applied to a multi-bit semiconductor storage device constructed basically of at least a static RAM and a digital integrated circuit device including such semiconductor storage device.

A memory array such as a static RAM to be packaged in a digital switch integrated circuit of a time sharing digital converter is divided in the extending direction of word lines to form a plurality of sub memory arrays. Array selecting signals for selecting those sub memory arrays and sub word line selecting signals for selecting sub word lines are combined to produce word line selecting signals selectively. Word line selecting signal lines for transmitting those word line selecting signals are arranged as main word lines in parallel with the sub word lines. Thus, sub word line drive circuits are provided for bringing the corresponding sub word lines selectively into selected states by combining at least 2 bits of the word line selecting signals in a manner to correspond to the individual sub word lines. Thus, the sub word lines and the main word lines can be coupled indirectly through the sub word line drive circuits to lighten the loads upon the main word lines. At the same time, only the word line selecting signals corresponding to the designated sub word lines can be selectively produced by combining the sub word line selecting signals and the array selecting signals to reduce the charge and discharge currents of the main word lines, i.e., the array selecting signal lines. Moreover, the sub word line drive circuits can be given a decoder function to extend array selecting conditions, thereby to increase the array dividing number. As a result, the reduction of the power consumption of the static RAM or the like can be promoted without restricting the high speed of the same, and the reduction of the power consumption and the increase in the capacity of the digital switch integrated circuit including the static RAM and accordingly the time sharing digital converter can be promoted.

What is claimed is:

1. A semiconductor memory comprising:
   a plurality of sub word lines arranged substantially in a straight line;
   a plurality of main word lines, each of which is arranged substantially in parallel with said straight line; and
   a plurality of gate circuits provided to correspond to said sub word lines,
   wherein each of said gate circuits is coupled to at least two of said main word lines for receiving at least two bits on said plurality of main word lines so that one of said sub word lines is selected on the basis of the signals from the at least two main word lines.

2. A semiconductor memory according to claim 1, further including:
   a plurality of main word line drivers provided to correspond to said main word lines,
   wherein said main word line drivers are controlled on the basis of column address signals and row address signals.

3. A semiconductor memory according to claim 2,
   wherein each of said gate circuits comprises a P-channel MOSFET connected between a first supply voltage and an output node coupled to a corresponding sub word line and an N-channel MOSFET connected between said output node and a first main word line, and wherein a gate of said P-channel MOSFET and a gate of said N-channel MOSFET are connected to a second main word line.

4. A semiconductor memory according to claim 3, further comprising:
   inverters provided to correspond to said gate circuits, each of which has an output terminal connected to said corresponding sub word line and an input terminal connected to said output node.

5. A semiconductor memory according to claim 3,
   wherein said main word lines are formed of a metal wiring layer and said sub word lines are formed of a gate material.

6. A semiconductor memory according to claim 3,
   wherein said semiconductor memory is a static RAM having a multi-bit structure for inputting or outputting storage data of a plurality of bits simultaneously and including a plurality of memory blocks each having a plurality of sub memory arrays provided to correspond to the individual bits of the storage data.

7. A semiconductor memory according to claim 6, wherein said semiconductor memory is packaged in a digital switch integrated circuit comprising a time sharing digital converter.

8. A semiconductor memory comprising:
a plurality of sub word lines arranged substantially in a straight line;
a first group of main word lines, each of which is arranged along said straight line;
a second group of main word lines, each of which is arranged substantially along said straight line; and
a plurality of gate circuits provided to correspond to said sub word lines,
wherein each of said gate circuits is coupled to one of said first group of main word lines and one of said second group of main word lines for receiving at least two bits of signals so that one of said sub word lines is selected on the basis of the signals from the one main word line of the first group of main word lines and the one main word line of the second group of main word lines.

9. A semiconductor memory according to claim 8, wherein each of said gate circuits comprises a P-channel MOSFET connected between a first supply voltage and an output node coupled to a corresponding sub word line and an N-channel MOSFET connected between said output node and a first main word line, and wherein a gate of said P-channel MOSFET and a gate of said N-channel MOSFET are connected to a second main word line.

10. A semiconductor memory according to claim 9, wherein each of said gate circuits comprises an inverter having an output terminal connected to said corresponding sub word line and an input terminal connected to said output node.

11. A semiconductor memory according to claim 10, wherein one of said first group of main word lines is made to be a selectively high state and one of said second group of main word lines is made to be a selectively low state for selecting one of said sub word lines.

12. A semiconductor memory according to claim 11, wherein each of said first and second group of main word lines is composed of four main word lines.

13. A semiconductor memory according to claim 12, wherein said semiconductor memory is a static RAM having a multi-bit structure for inputting or outputting storage data of a plurality of bits simultaneously and including a plurality of memory blocks each having a plurality of sub memory arrays provided to correspond to the individual bits of the storage data.

14. A semiconductor memory according to claim 13, wherein said semiconductor memory is packaged in a digital switch integrated circuit comprising a time sharing digital converter.

* * * * *